US010374583B1

(12) United States Patent
Olejarz et al.

(10) Patent No.: US 10,374,583 B1
(45) Date of Patent: Aug. 6, 2019

(54) DYNAMIC HYSTERESIS CIRCUIT

(71) Applicant: Analog Devices, Inc., Norwood, MA (US)

(72) Inventors: Piotr Olejarz, Watertown, MA (US); Daniel Saari, Norwood, MA (US); Ara Arakelian, Watertown, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/943,341

(22) Filed: Apr. 2, 2018

(51) Int. Cl.
| | |
|---|---|
| *H03K 3/00* | (2006.01) |
| *H03K 3/0233* | (2006.01) |
| *H03K 3/037* | (2006.01) |
| *H03K 5/08* | (2006.01) |
| *H04L 7/00* | (2006.01) |
| *G06F 13/38* | (2006.01) |
| *G06F 13/42* | (2006.01) |
| *G06F 13/24* | (2006.01) |
| *H04J 3/06* | (2006.01) |
| *G06F 13/40* | (2006.01) |
| *G06F 16/60* | (2019.01) |

(52) U.S. Cl.
CPC ......... *H03K 3/02337* (2013.01); *G06F 13/24* (2013.01); *G06F 13/385* (2013.01); *G06F 13/4072* (2013.01); *G06F 13/4291* (2013.01); *G06F 13/4295* (2013.01); *G06F 16/60* (2019.01); *H03K 3/0377* (2013.01); *H03K 5/086* (2013.01); *H04J 3/0647* (2013.01); *H04L 7/0008* (2013.01)

(58) Field of Classification Search
CPC ................... G06K 9/4604; H06T 7/13; G06T 2207/10116
See application file for complete search history.

(56) References Cited

U.S. PATENT DOCUMENTS

| | | | |
|---|---|---|---|
| 4,940,907 A | 7/1990 | Laude | |
| 5,085,224 A * | 2/1992 | Galen | .................. A61B 5/0006 128/903 |
| 5,155,386 A | 10/1992 | Abdi | |
| 5,819,051 A | 10/1998 | Murray et al. | |
| 7,158,596 B2 | 1/2007 | Knapp et al. | |
| 7,272,202 B2 | 9/2007 | Knapp et al. | |
| 7,315,551 B2 | 1/2008 | Olson et al. | |
| 7,395,362 B2 | 7/2008 | Drexler et al. | |
| 7,539,804 B2 | 5/2009 | Miura | |
| 7,685,449 B2 | 3/2010 | Terasawa | |
| 7,707,437 B2 | 4/2010 | Berenbaum et al. | |
| 7,802,036 B2 | 9/2010 | Takeuchi | |
| 7,966,379 B2 | 6/2011 | Berenbaum et al. | |
| 8,147,338 B2 | 4/2012 | Hutchison-Kay | |

(Continued)

*Primary Examiner* — Sibin Chen
(74) *Attorney, Agent, or Firm* — Patent Capital Group

(57) ABSTRACT

A method is described and in one embodiment includes detecting a transition of a data signal comprising a data packet received at a circuit while the circuit is in a first hysteresis mode; placing the circuit in a second hysteresis mode subsequent to the detecting; and returning the receiver to the first hysteresis mode subsequent to completion of receipt of the data packet to await receipt of a next data packet. In certain embodiments, the first hysteresis mode is a high hysteresis mode and the second hysteresis mode is a standard hysteresis mode. In some embodiments, a level of each of the first and second hysteresis modes is dynamically tunable.

20 Claims, 24 Drawing Sheets

(56) References Cited

U.S. PATENT DOCUMENTS

| | | |
|---|---|---|
| 8,156,274 B2 | 4/2012 | Kapelner |
| 8,185,759 B1 | 5/2012 | Li et al. |
| 8,600,583 B2 | 12/2013 | Fervel et al. |
| 8,615,091 B2 | 12/2013 | Terwal |
| 8,667,194 B2 | 3/2014 | Dybsetter et al. |
| 8,745,305 B2 | 6/2014 | Toba et al. |
| 8,806,083 B2 | 8/2014 | Doorenbos |
| 8,873,659 B2 | 10/2014 | Wang et al. |
| 8,901,980 B1 | 12/2014 | Naish et al. |
| 8,987,933 B2 | 3/2015 | Yu |
| 9,397,622 B2 | 7/2016 | Vashishtha et al. |
| 2007/0064779 A1* | 3/2007 | Kappes .............. H03K 3/02337 375/219 |
| 2008/0048746 A1 | 2/2008 | Raman |
| 2010/0237908 A1 | 9/2010 | Chatal |
| 2012/0093342 A1 | 4/2012 | Rupprecht et al. |
| 2013/0124763 A1 | 5/2013 | Kessler |
| 2014/0025999 A1 | 1/2014 | Kessler |
| 2014/0095750 A1 | 4/2014 | Tailliet |
| 2014/0101351 A1 | 4/2014 | Hooper et al. |
| 2014/0101477 A1 | 4/2014 | Patterson |
| 2014/0223054 A1 | 8/2014 | Hasan et al. |
| 2014/0281077 A1 | 9/2014 | Biskup |
| 2014/0281078 A1 | 9/2014 | Biskup |
| 2014/0281079 A1 | 9/2014 | Biskup |
| 2014/0362865 A1 | 12/2014 | Chini et al. |
| 2015/0008960 A1 | 1/2015 | Lahr |
| 2015/0009050 A1 | 1/2015 | Lahr et al. |
| 2015/0032599 A1 | 1/2015 | Agapitov |
| 2015/0061729 A1 | 3/2015 | DeGeronimo |
| 2015/0301968 A1 | 10/2015 | Kessler |
| 2015/0365754 A1 | 12/2015 | Perl |
| 2016/0034416 A1 | 2/2016 | Chavez et al. |
| 2016/0034417 A1 | 2/2016 | Chavez et al. |
| 2016/0041941 A1 | 2/2016 | Kessler et al. |
| 2016/0196817 A1 | 7/2016 | Mortensen et al. |
| 2017/0220502 A1 | 8/2017 | Kessler et al. |
| 2017/0222790 A1 | 8/2017 | Hooper et al. |
| 2017/0222829 A1 | 8/2017 | Kessler |
| 2017/0308352 A1 | 10/2017 | Kessler |
| 2018/0060269 A1 | 3/2018 | Kessler |

\* cited by examiner

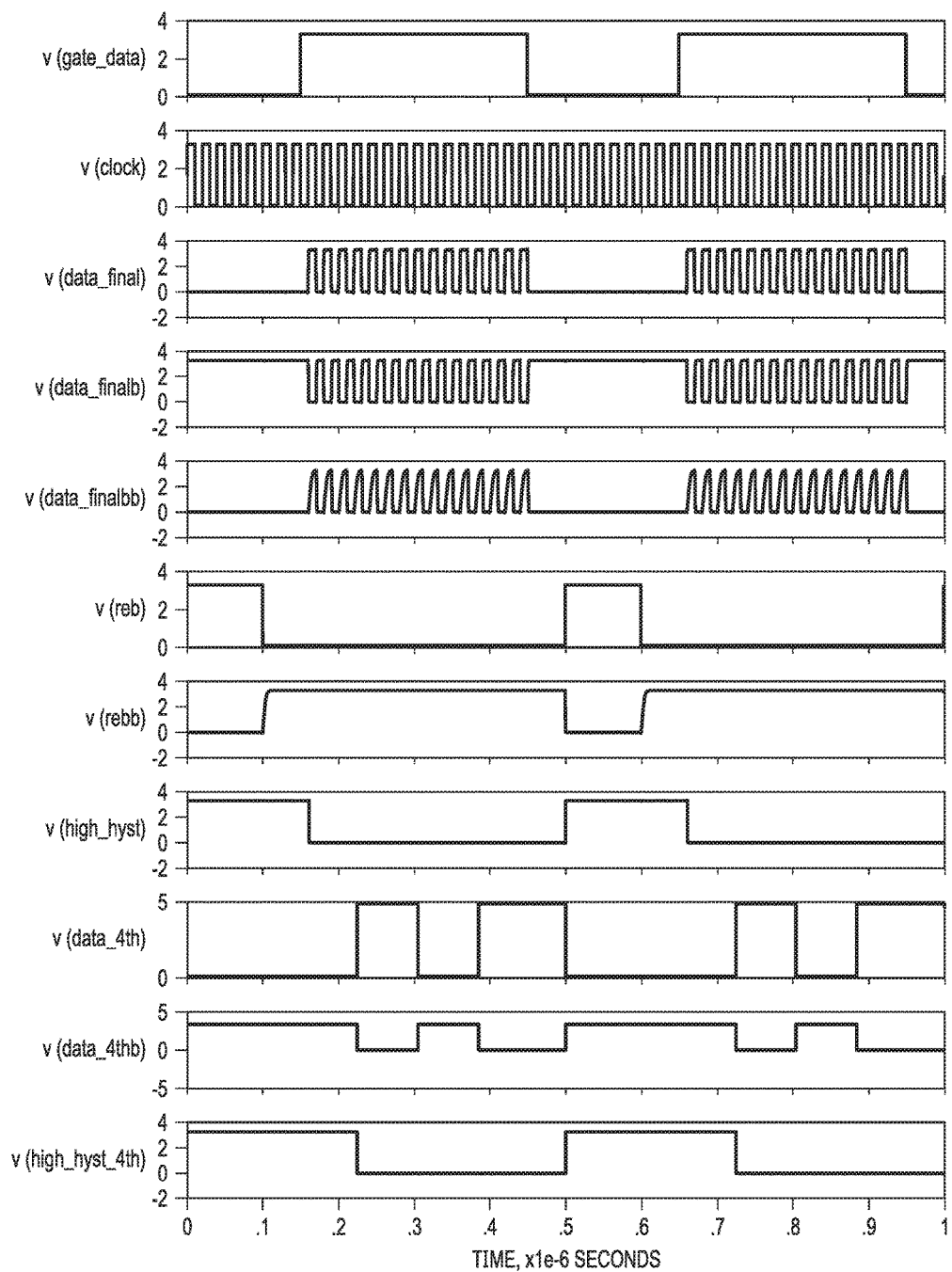

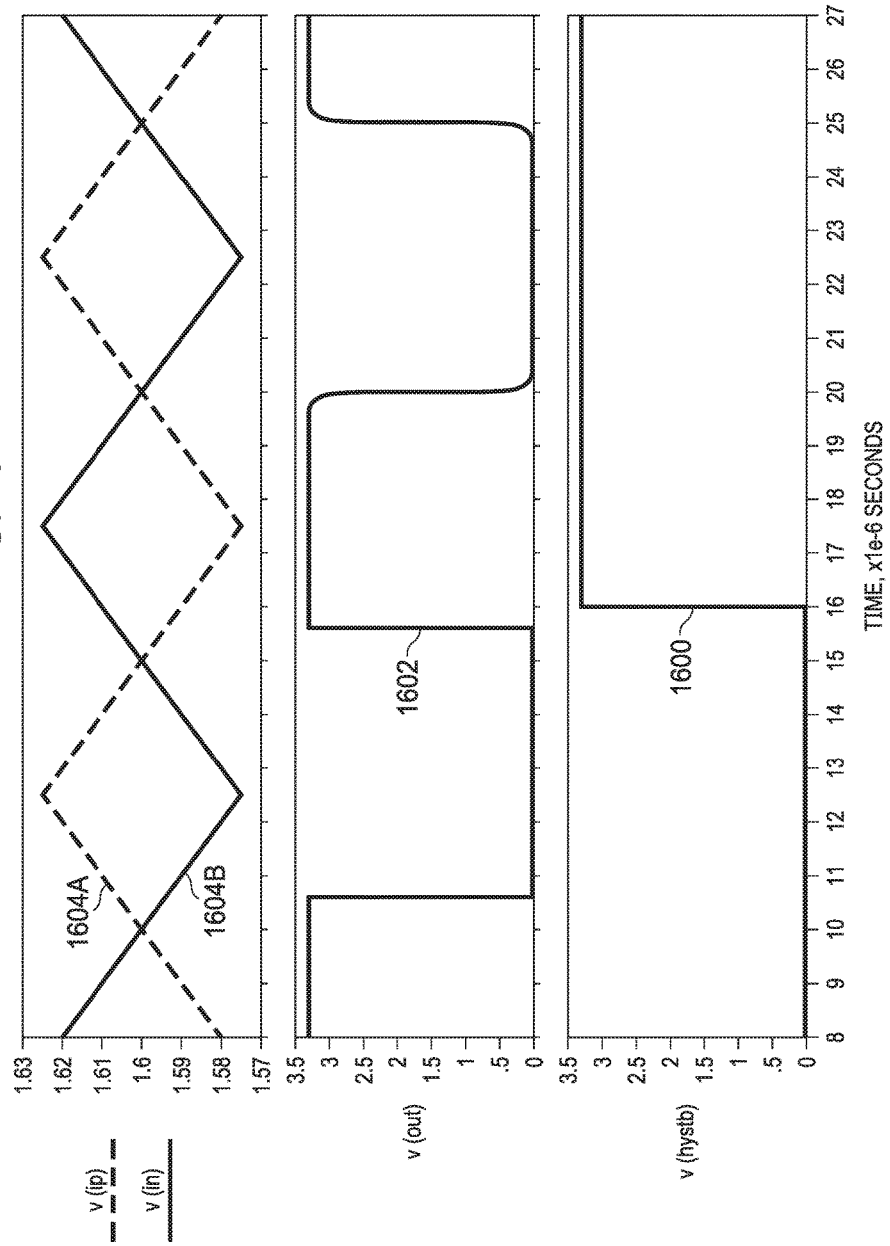

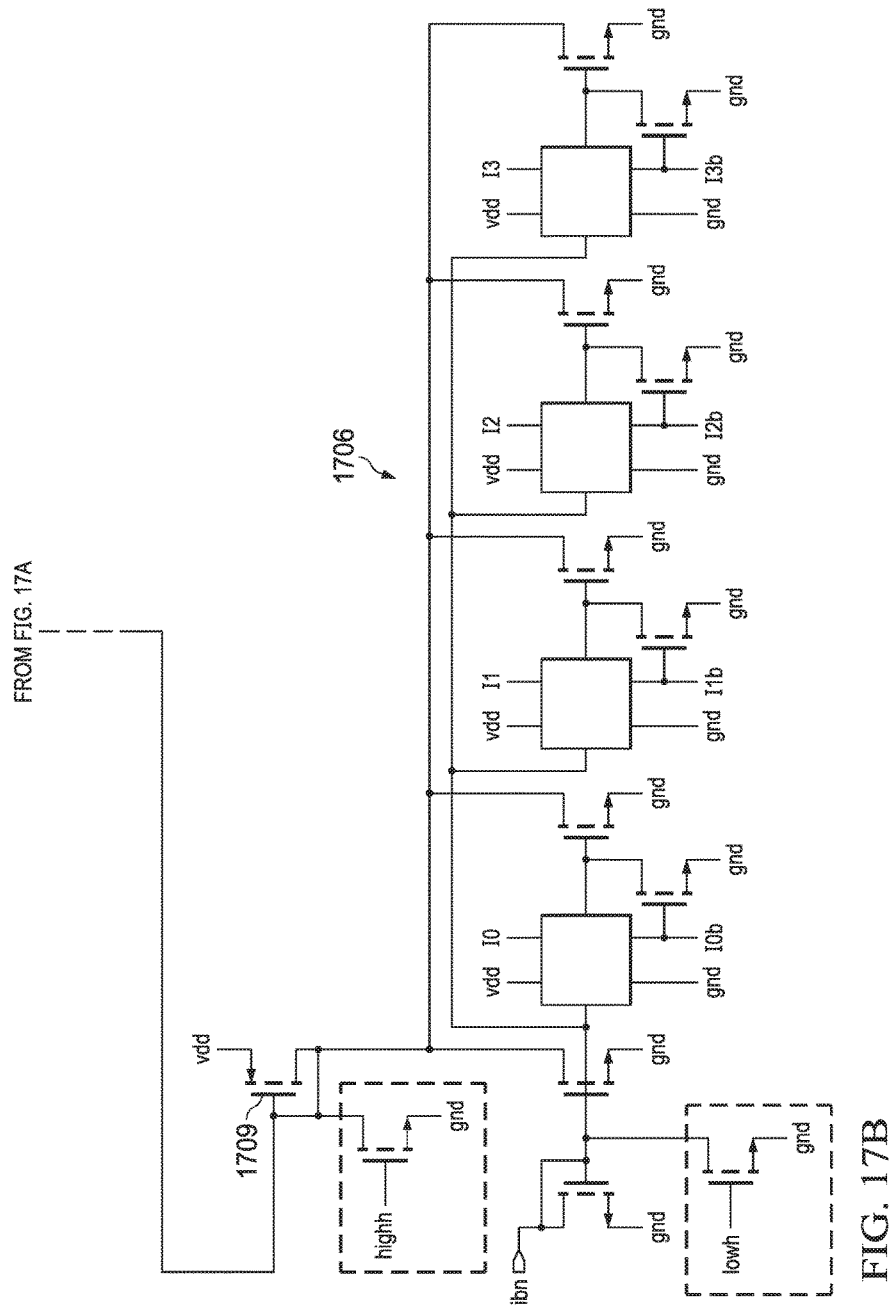

DYNAMIC HYSTERESIS CIRCUIT

BACKGROUND

Hysteresis in a receiver acts as a threshold to hedge against noise on a data communications line and thus minimize the risk of a false trigger detect. As used herein, hysteresis is a delay, or lag, between a transition of an input signal and a corresponding transition of an output signal.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 15A and 15B respectively illustrate timing diagrams of various signals of the circuits of FIGS. 14A and 14B, respectively, showing multiple transitions between a high hysteresis mode and a standard, lower hysteresis mode in accordance with various embodiments.

FIG. 16 is a diagram illustrating an example of operation of high hysteresis mode in accordance with various embodiments.

FIGS. 17A-17B collectively illustrate a high-level block diagram of a receiver circuit in which a DH technique in accordance with various embodiments may be implemented.

DETAILED DESCRIPTION

Figure 1:
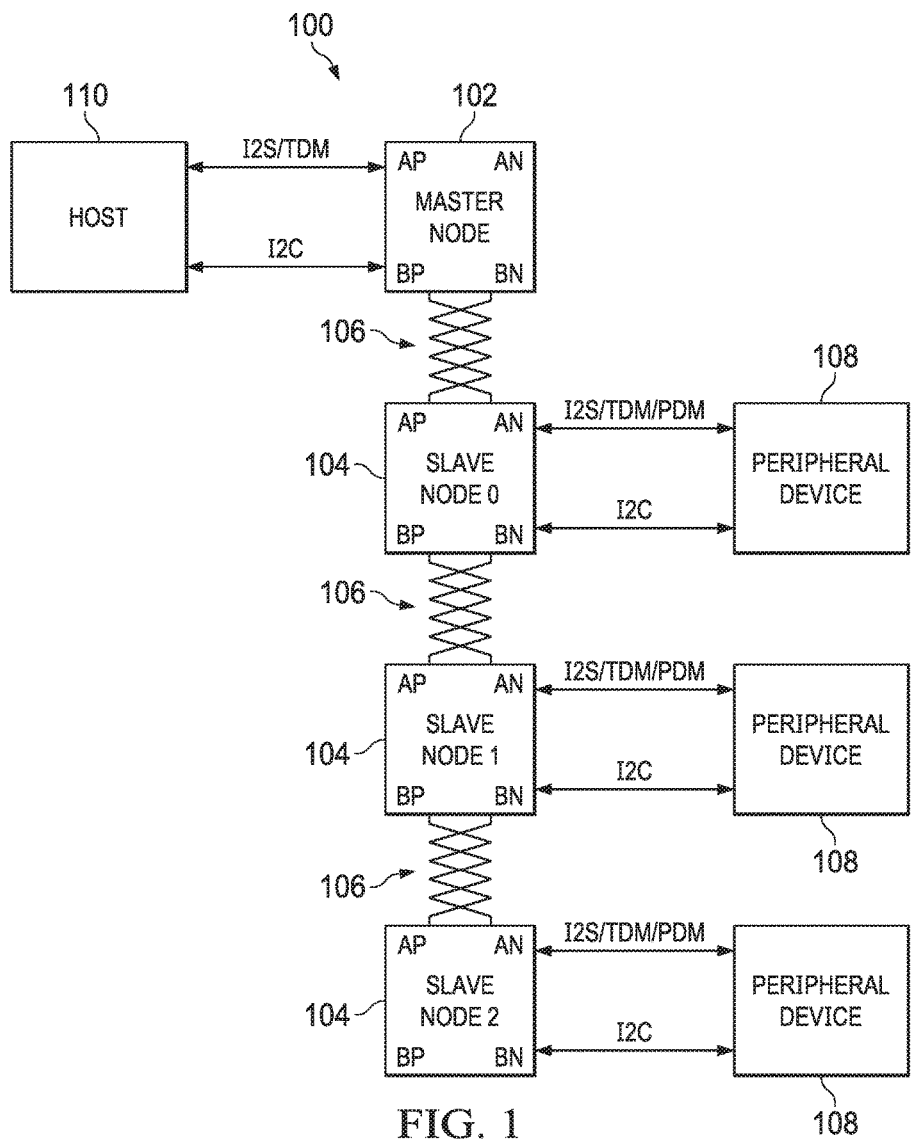
FIG. 1 is a block diagram of an illustrative communication system in which embodiments of a comparator with dynamic hysteresis ("DH") capabilities may be advantageously implemented.

Disclosed herein are receiver designs that rely on two or more different hysteresis setting in a comparator stage. As previously noted, hysteresis in a receiver acts as a threshold to hedge against noise on the line and thus minimize the risk of a false trigger detect. Embodiments described herein include methods for increasing hysteresis when undesired noise is present on data lines. This may be desired, for example, when a receiver is waiting idle to detect a first transition of a packet, especially in systems in which the clock signal is encoded in the data packets and a separate clock or synchronization signal is not transmitted.

In accordance with features of embodiments described herein, the first edge, or the first few edges, may be detected using a more predictable and/or stricter detection scheme using a receiver ("RX") hysteresis that is higher than a standard (lower) hysteresis, thereby ensuring that the internal clock data recovery does not lock to noise. Additionally, transitioning from a higher to a lower hysteresis results in decreased susceptibility to metastability.

In certain embodiments, the transmitter ("TX") that transmits from the other side of the cable may be optimized to send the first or first few bits with a higher amplitude, as the RX is initially set in high hysteresis mode when it is idle and listening to the line. Additionally, the hysteresis may be asymmetrical, with a higher hysteresis for one of the 0 to 1 or 1 to 0 transition, or symmetrical, with the same hysteresis for each of the 0 to 1 and 1 to 0 transitions.

As will be described in greater detail below, a dynamic hysteresis ("DH") technique in accordance with embodiments described herein includes determining the controls of the hysteresis settings that are timing dependent and setting when the hysteresis is higher and when it is lower. The DH technique further includes the addition of key elements to the standard comparator circuit to enable a plurality of hysteresis modes.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

Various components may be referred to or illustrated herein in the singular (e.g., a "processor," a "peripheral device," etc.), but this is simply for ease of discussion, and any element referred to in the singular may include multiple such elements in accordance with the teachings herein.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, the term "circuitry" may refer to, be part of, or include an application-specific integrated circuit (ASIC), an electronic circuit, and optical circuit, a processor (shared, dedicated, or group), and/or memory (shared, dedicated, or group) that execute one or more software or firmware programs, a combinational logic circuit, and/or other suitable hardware that provide the described functionality. A master node may also be referred to as a master "device" herein; similarly, a slave node may be referred to as a slave "device" herein.

FIG. 1 is a block diagram of an illustrative half-duplex two-wire communication system 100, in accordance with various embodiments in which embodiments of a comparator with dynamic hysteresis ("DH") capabilities may be advantageously implemented. The system 100 includes a host 110, a master node 102 and at least one slave node 104. In FIG. 1, three slave nodes (0, 1, and 2) are illustrated. The depiction of three slave nodes 104 in FIG. 1 is simply illustrative, and the system 100 may include one, two, or more slave nodes 104, as desired.

The master node 102 may communicate with the slave nodes 104 over a two-wire bus 106. The bus 106 may include different two-wire bus links between adjacent nodes along the bus 106 to connect the nodes along the bus 106 in a daisy-chain fashion. For example, as illustrated in FIG. 1, the bus 106 may include a link coupling the master node 102 to the slave node 0, a link coupling the slave node 0 to the slave node 1, and a link coupling the slave node 1 to the slave node 2. In some embodiments, the links of the bus 106 may each be formed of a single twisted wire pair (e.g., an unshielded twisted pair). In some embodiments, the links of the bus 106 may each be formed of a coax cable (e.g., with the core providing the "positive" line and the shield providing the "negative" line, or vice versa).

The host 110 may include a processor that programs the master node 102, and acts as the originator and recipient of various payloads transmitted along the bus 106. In some embodiments, the host 110 may be or may include a microcontroller, for example. In particular, the host 110 may be the master of Inter-Integrated Circuit Sound (I2S) communications that happen along the bus 106. The host 110 may communicate with the master node 102 via an I2S/Time Division Multiplex (TDM) bus and/or an Inter-Integrated Circuit (I2C) bus. In some embodiments, the master node 102 may be a transceiver (e.g., the node transceiver 120 discussed below with reference to FIG. 2) located within a housing of the host 110. The master node 102 may be programmable by the host 110 over the I2C bus for configuration and read-back, and may be configured to generate clock, synchronization, and framing for all of the slave nodes 104. In some embodiments, an extension of the I2C control bus between the host 110 in the master node 102 may be embedded in the data streams transmitted over the bus 106, allowing the host 110 direct access to registers and status information for the one or more slave nodes 104, as well as enabling I2C-to-I2C communication over distance to allow the host 110 to control the peripherals 108.

The master node 102 may generate "downstream" signals (e.g., data signals, power signals, etc., transmitted away from the master node 102 along the bus 106) and receive "upstream" signals (e.g., transmitted toward the master node 102 along the bus 106). The master node 102 may provide a clock signal for synchronous data transmission over the bus 106. As used herein, "synchronous data" may include data streamed continuously (e.g., audio signals) with a fixed time interval between two successive transmissions to/from the same node along the bus 106. In some embodiments, the clock signal provided by the master node 102 may be derived from an I2S input provided to the master node 102 by the host 110. A slave node 104 may be an addressable network connection point that represents a possible destination for data frames transmitted downstream on the bus 106 or upstream on the bus 106. A slave node 104 may also represent a possible source of downstream or upstream data frames. The system 100 may allow for control information and other data to be transmitted in both directions over the bus 106 from one node to the next. One or more of the slave nodes 104 may also be powered by signals transmitted over the bus 106.

In particular, each of the master node 102 and the slave nodes 104 may include a positive upstream terminal (denoted as "AP"), a negative upstream terminal (denoted as "AN"), a positive downstream terminal (denoted as "BP"), and a negative downstream terminal (denoted as "BN"). The positive and negative downstream terminals of a node may be coupled to the positive and negative upstream terminals of the adjacent downstream node, respectively. As shown in FIG. 1, the master node 102 may include positive and negative upstream terminals, but these terminals may not be used; in other embodiments, the master node 102 may not include positive and negative upstream terminals. The last slave node 104 along the bus 106 (the slave node 2 in FIG. 1) may include positive and negative downstream terminals, but these terminals may not be used; in other embodiments, the last slave node 104 along the bus may not include positive and negative downstream terminals.

As discussed in detail below, the master node 102 may periodically send a synchronization control frame downstream, optionally along with data intended for one or more of the slave nodes 104. For example, the master node 102 may transmit a synchronization control frame every 1024 bits (representing a superframe) at a frequency of 48 kHz, resulting in an effective bit rate on the bus 106 of 49.152 Mbps. Other rates may be supported, including, for example, 44.1 kHz. The synchronization control frame may allow the slave nodes 104 to identify the beginning of each superframe and also, in combination with physical layer encoding/signaling, may allow each slave node 104 to derive its internal operational clock from the bus 106. The synchronization control frame may include a preamble for signaling the start of synchronization, as well as control fields that allow for various addressing modes (e.g., normal, broadcast, discovery), configuration information (e.g., writing to registers of the slave nodes 104), conveyance of I2C information, remote control of certain general-purpose input/output (GPIO) pins at the slave nodes 104, and other services. A portion of the synchronization control frame following the preamble and the payload data may be scrambled in order to reduce the likelihood that information in the synchronization control frame will be mistaken for a new preamble, and to flatten the spectrum of related electromagnetic emissions.

The synchronization control frame may get passed between slave node 104 (optionally along with other data, which may come from the master node 102 but additionally or alternatively may come from one or more upstream slave nodes 104 or from a slave node 104 itself) until it reaches the last slave node 104 (i.e., the slave node 2 in FIG. 1), which has been configured by the master node 102 as the last slave node 104 or has self-identified itself as the last slave node 104. Upon receiving the synchronization control frame, the last slave node 104 may transmit a synchronization response frame followed by any data that it is permitted to transmit (e.g., a 24-bit audio sample in a designated time slot). The synchronization response frame may be passed upstream between slave nodes 104 (optionally along with data from downstream slave nodes 104), and based on the synchronization response frame, each slave node 104 may be able to identify a time slot, if any, in which the slave node 104 is permitted to transmit.

In some embodiments, one or more of the slave nodes 104 in the system 100 may be coupled to and communicate with a peripheral device 108. For example, a slave node 104 may be configured to read data from and/or write data to the associated peripheral device 108 using I2S, pulse density modulation (PDM), TDM, and/or I2C protocols, as discussed below. Although the "peripheral device 108" may be referred to in the singular herein, this is simply for ease of discussion, and a single slave node 104 may be coupled with zero, one, or more peripheral devices. Examples of peripheral devices that may be included in the peripheral device 108 may include a digital signal processor (DSP), a field programmable gate array (FPGA), an application-specific integrated circuit (ASIC), an analog to digital converter (ADC), a digital to analog converter (DAC), a codec, a microphone, a microphone array, a speaker, an audio amplifier, a protocol analyzer, an accelerometer or other motion sensor, an environmental condition sensor (e.g., a temperature, humidity, and/or gas sensor), a wired or wireless communication transceiver, a display device (e.g., a touch-screen display), a user interface component (e.g., a button, a dial, or other control), a camera (e.g., a video camera), a memory device, or any other suitable device that transmits and/or receives data. A number of examples of different peripheral device configurations are discussed in detail herein.

In some embodiments, the peripheral device 108 may include any device configured for Inter-Integrated Circuit Sound (I2S) communication; the peripheral device 108 may communicate with the associated slave node 104 via the I2S protocol. In some embodiments, the peripheral device 108 may include any device configured for Inter-Integrated Circuit (I2C) communication; the peripheral device 108 may communicate with the associated slave node 104 via the I2C protocol. In some embodiments, a slave node 104 may not be coupled to any peripheral device 108.

A slave node 104 and its associated peripheral device 108 may be contained in separate housings and coupled through a wired or wireless communication connection or may be contained in a common housing. For example, a speaker connected as a peripheral device 108 may be packaged with the hardware for an associated slave node 104 (e.g., the node transceiver 120 discussed below with reference to FIG. 2), such that the hardware for the associated slave node 104 is contained within a housing that includes other speaker components. The same may be true for any type of peripheral device 108.

As discussed above, the host 110 may communicate with and control the master node 102 using multi-channel I2S and I2C communication protocols. In particular, the host 110 may transmit data via I2S to a frame buffer (not illustrated) in the master node 102, and the master node 102 may read data from the frame buffer and transmit the data along the bus 106. Analogously, the master node 102 may store data received via the bus 106 in the frame buffer, and then may transmit the data to the host 110 via I2S.

Each slave node 104 may have internal control registers that may be configured by communications from the master node 102. A number of such registers are discussed in detail below. Each slave node 104 may receive downstream data and may retransmit the data further downstream. Each slave node 104 may receive and/or generate upstream data and/or retransmit data upstream and/or add data to and upstream transaction.

Communications along the bus 106 may occur in periodic superframes. Each superframe may begin with a downstream synchronization control frame; be divided into periods of downstream transmission (also called "downstream portions"), upstream transmission (also called "upstream portions"), and no transmission (where the bus 106 is not driven); and end just prior to transmission of another downstream synchronization control frame. The master node 102 may be programmed (by the host 110) with a number of downstream portions to transmit to one or more of the slave nodes 104 and a number of upstream portions to receive from one or more of the slave nodes 104. Each slave node 104 may be programmed (by the master node 102) with a number of downstream portions to retransmit down the bus 106, a number of downstream portions to consume, a number of upstream portions to retransmit up the bus 106, and a number of upstream portions in which the slave node 104 may transmit data received from the slave node 104 from the associated peripheral device 108. Communication along the bus 106 is discussed in further detail below with reference to FIGS. 2-12.

Figure 2:
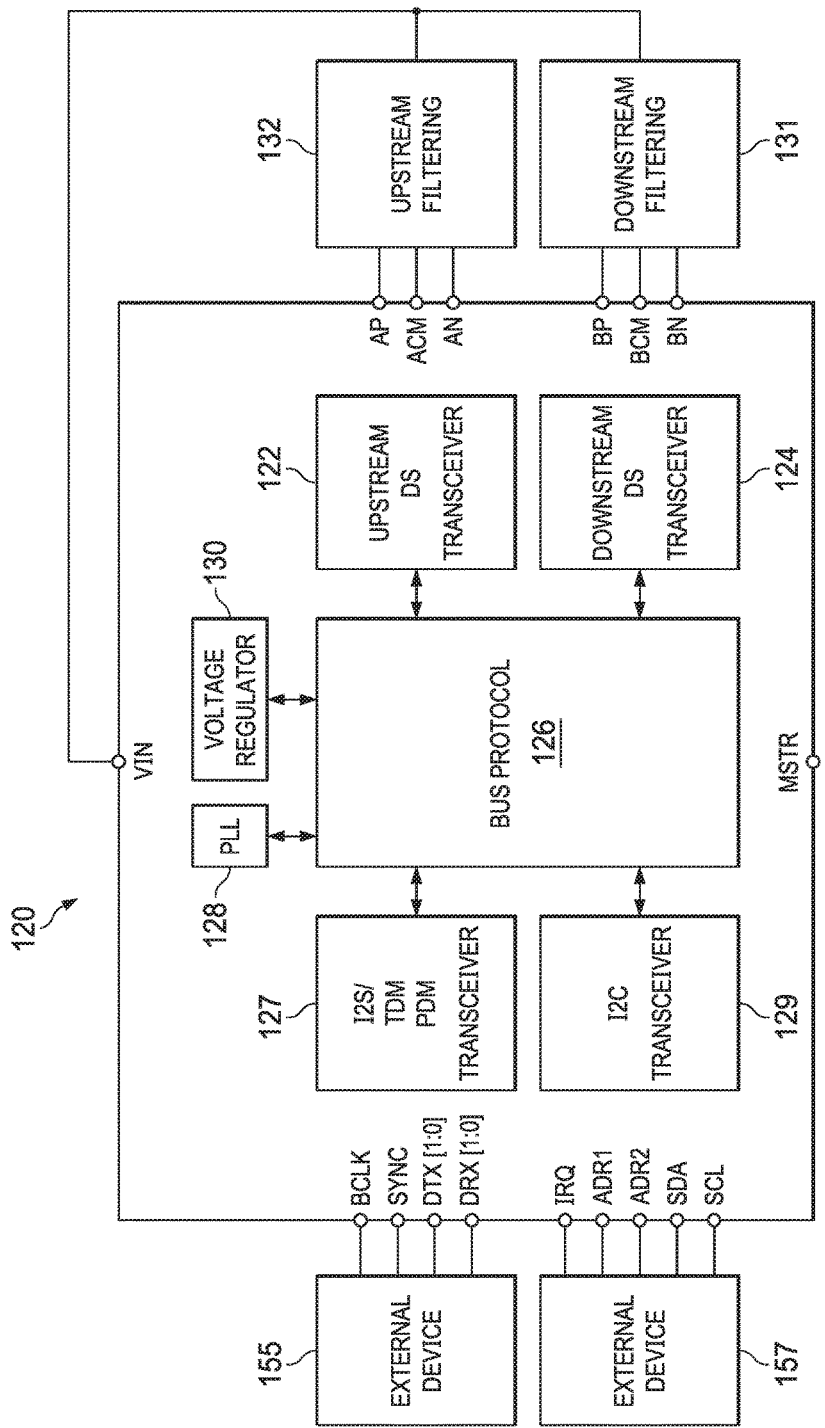
FIG. 2 is a block diagram of a node transceiver that may be included in a node of the system of FIG. 1, in accordance with various embodiments.

Each of the master node 102 and the slave nodes 104 may include a transceiver to manage communication between components of the system 100. FIG. 2 is a block diagram of a node transceiver 120 that may be included in a node (e.g., the master node 102 or a slave node 104) of the system 100 of FIG. 1, in accordance with various embodiments. In some embodiments, a node transceiver 120 may be included in each of the nodes of the system 100, and a control signal may be provided to the node transceiver 120 via a master (MSTR) pin to indicate whether the node transceiver 120 is to act as a master (e.g., when the MSTR pin is HIGH) or a slave (e.g., when the MSTR pin is low).

The node transceiver 120 may include an upstream differential signaling (DS) transceiver 122 and a downstream DS transceiver 124. The upstream DS transceiver 122 may be coupled to the positive and negative upstream terminals discussed above with reference to FIG. 1, and the downstream DS transceiver 124 may be coupled to the positive and negative downstream terminals discussed above with reference to FIG. 1. In some embodiments, the upstream DS transceiver 122 may be a low voltage DS (LVDS) transceiver, and the downstream DS transceiver 124 may be an LVDS transceiver. Each node in the system 100 may be AC-coupled to the bus 106, and data signals may be conveyed along the bus 106 (e.g., via the upstream DS transceiver 122 and/or the downstream DS transceiver 124) using a predetermined form of DS (e.g., LVDS or Multipoint LVDS (MLVDS) or similar signaling) with appropriate encoding to provide timing information over the bus 106 (e.g., differential Manchester coding, biphase mark coding, Manchester coding, Non-Return-to-Zero, Inverted (NRZI) coding with run-length limiting, or any other suitable encoding).

The upstream DS transceiver 122 and the downstream DS transceiver 124 may communicate with bus protocol circuitry 126, and the bus protocol circuitry 126 may communicate with a phased locked loop (PLL) 128 and voltage regulator circuitry 130, among other components. When the node transceiver 120 is powered up, the voltage regulator circuitry 130 may raise a "power good" signal that is used by the PLL 128 as a power-on reset.

As noted above, one or more of the slave nodes 104 in the system 100 may receive power transmitted over the bus 106 concurrently with data. This mode of operation may be referred to herein as "phantom power." For power distribution (which is optional, as some of the slave nodes 104 may be configured to have exclusively local power provided to them), the master node 102 may place a DC bias on the bus link between the master node 102 and the slave node 0 (e.g., by connecting one of the downstream terminals to a voltage source provided by a voltage regulator and the other downstream terminal to ground). The DC bias may be a predetermined voltage, such as 5 V, 8 V, the voltage of a car battery, or a higher voltage. Each successive slave node 104 can selectively tap its upstream bus link to recover power (e.g., using the voltage regulator circuitry 130). This power may be used to power the slave node 104 itself (and optionally one or more peripheral device 108 coupled to the slave node 104). A slave node 104 may also selectively bias the bus link downstream for the next-in-line slave node 104 with either the recovered power from the upstream bus link or from a local power supply. For example, the slave node 0 may use the DC bias on the upstream bus link 106 to recover power for the slave node 0 itself and/or for one or more associated peripheral device 108, and/or the slave node 0 may recover power from its upstream bus link 106 to bias its downstream bus link 106.

Thus, in some embodiments, each node in the system 100 may provide power to the following downstream node over a downstream bus link. The powering of nodes may be performed in a sequenced manner. For example, after discovering and configuring the slave node 0 via the bus 106, the master node 102 may instruct the slave node 0 to provide power to its downstream bus link 106 in order to provide power to the slave node 1; after the slave node 1 is discovered and configured, the master node 102 may instruct the slave node 1 to provide power to its downstream bus link 106 in order to provide power to the slave node 2 (and so on for additional slave nodes 104 coupled to the bus 106. In some embodiments, one or more of the slave nodes 104 may be locally powered, instead of or in addition to being powered from its upstream bus link. In some such embodiments, the local power source for a given slave node 104 may be used to provide power to one or more downstream slave nodes.

In some embodiments, upstream filtering circuitry 132 may be disposed between the upstream DS transceiver 122 and the voltage regulator circuitry 130, and downstream filtering circuitry 131 may be disposed between the downstream DS transceiver 124 and the voltage regulator circuitry 130. Since each link of the bus 106 may carry AC (signal) and DC (power) components, the upstream filtering circuitry 132 and the downstream filtering circuitry 131 may separate the AC and DC components, providing the AC components to the upstream DS transceiver 122 and the downstream DS transceiver 124, and providing the DC components to the voltage regulator 130. AC couplings on the line side of the upstream DS transceiver 122 and downstream DS transceiver 124 substantially isolate the transceivers 122 and 124 from the DC component on the line to allow for high-speed bi-directional communications. As discussed above, the DC component may be tapped for power, and the upstream filtering circuitry 132 and the downstream filtering circuitry 131 may include a ferrite, a common mode choke, or an inductor, for example, to reduce the AC component provided to the voltage regulator circuitry 130. In some embodiments, the upstream filtering circuitry 132 may be included in the upstream DS transceiver 122, and/or the downstream filtering circuitry 131 may be included in the downstream DS transceiver 124; in other embodiments, the filtering circuitry may be external to the transceivers 122 and 124.

The node transceiver 120 may include a transceiver 127 for I2S, TDM, and PDM communication between the node transceiver 120 and an external device 155. Although the "external device 155" may be referred to in the singular herein, this is simply for ease of illustration, and multiple external devices may communicate with the node transceiver 120 via the I2S/TDM/PDM transceiver 127. As known in the art, the I2S protocol is for carrying pulse code modulated (PCM) information (e.g., between audio chips on a printed circuit board (PCB)). As used herein, "I2S/TDM" may refer to an extension of the I2S stereo (2-channel) content to multiple channels using TDM. As known in the art, PDM may be used in sigma delta converters, and in particular, PDM format may represent an over-sampled 1-bit sigma delta ADC signal before decimation. PDM format is often used as the output format for digital microphones. The I2S/TDM/PDM transceiver 127 may be in communication with the bus protocol circuitry 126 and pins for communication with the external device 155. Six pins, BCLK, SYNC, DTX[1:0], and DRX[1:0], are illustrated in FIG. 2; the BCLK pin may be used for an I2S bit clock, the SYNC pin may be used for an I2S frame synchronization signal, and the DTX[1:0] and DRX[1:0] pins are used for transmit and receive data channels, respectively. Although two transmit pins (DTX[1:0]) and two receive pins (DRX[1:0]) are illustrated in FIG. 2, any desired number of receive and/or transmit pins may be used.

When the node transceiver 120 is included in the master node 102, the external device 155 may include the host 110, and the I2S/TDM/PDM transceiver 127 may provide an I2S slave (in regard to BCLK and SYNC) that can receive data from the host 110 and send data to the host 110 synchronously with an I2S interface clock of the host 110. In particular, an I2S frame synchronization signal may be received at the SYNC pin as an input from the host 110, and the PLL 128 may use that signal to generate clocks. When the node transceiver 120 is included in a slave node 104, the external device 155 may include one or more peripheral devices 108, and the I2S/TDM/PDM transceiver 127 may provide an I2S clock master (for BCLK and SYNC) that can control I2S communication with the peripheral device 108. In particular, the I2S/TDM/PDM transceiver 127 may provide an I2S frame synchronization signal at the SYNC pin as an output. Registers in the node transceiver 120 may determine which and how many I2S/TDM channels are being transmitted as data slots over the bus 106. A TDM mode (TDM MODE) register in the node transceiver 120 may store a value of how many TDM channels fit between consecutive SYNC pulses on a TDM transmit or receive pin. Together with knowledge of the channel size, the node transceiver 120 may automatically set the BCLK rate to match the number of bits within the sampling time (e.g., 48 kHz).

The node transceiver 120 may include a transceiver 129 for I2C communication between the node transceiver 120 and an external device 157. Although the "external device 157" may be referred to in the singular herein, this is simply for ease of illustration, and multiple external devices may communicate with the node transceiver 120 via the I2C transceiver 129. As known in the art, the I2C protocol uses clock (SCL) and data (SDA) lines to provide data transfer. The I2C transceiver 129 may be in communication with the bus protocol circuitry 126 and pins for communication with the external device 157. Four pins, ADR1, ADR2, SDA, and SCL are illustrated in FIG. 2; ADR1 and ADR2 may be used to modify the I2C addresses used by the node transceiver 120 when the node transceiver 120 acts as an I2C slave (e.g., when it is included in the master node 102), and SDA and SCL are used for the I2C serial data and serial clock signals, respectively. When the node transceiver 120 is included in the master node 102, the external device 157 may include the host 110, and the I2C transceiver 129 may provide an I2C slave that can receive programming instructions from the host 110. In particular, an I2C serial clock signal may be received at the SCL pin as an input from the host 110 for register accesses. When the node transceiver 120 is included in a slave node 104, the external device 157 may include a peripheral device 108 and the I2C transceiver 129 may provide an I2C master to allow the I2C transceiver to program one or more peripheral devices in accordance with instructions provided by the host 110 and transmitted to the node transceiver 120 via the bus 106. In particular, the I2C transceiver 129 may provide the I2C serial clock signal at the SCL pin as an output.

The node transceiver 120 may include an interrupt request (IRQ) pin in communication with the bus protocol circuitry 126. When the node transceiver 120 is included in the master node 102 via the I2C transceiver 129, the bus protocol circuitry 126 may provide event-driven interrupt requests toward the host 110 via the IRQ pin. When the node transceiver 120 is included in a slave node 104 (e.g., when the MSTR pin is low), the IRQ pin may serve as a GPIO pin with interrupt request capability. The node transceiver 120 may include other pins in addition to those shown in FIG. 2 (e.g., the SENSE and VSSN pins discussed below with reference to FIGS. 14-28).

The system 100 may operate in any of a number of different operational modes. The nodes on the bus 106 may each have a register indicating which operational mode is currently enabled. Descriptions follow of examples of various operational modes that may be implemented. In a standby operational mode, bus activity is reduced to enable global power savings; the only traffic required is a minimal downstream preamble to keep the PLLs of each node (e.g., the PLL 128) synchronized. In standby operational mode, reads and writes across the bus 106 are not supported. In a discovery operational mode, the master node 102 may send predetermined signals out along the bus 106 and wait for suitable responses to map out the topology of slave nodes 104 distributed along the bus 106. In a normal operational mode, full register access may be available to and from the slave nodes 104 as well as access to and from peripheral devices 108 over the bus 106. Normal mode may be globally configured by the host 110 with or without synchronous upstream data and with or without synchronous downstream data.

Figure 3:
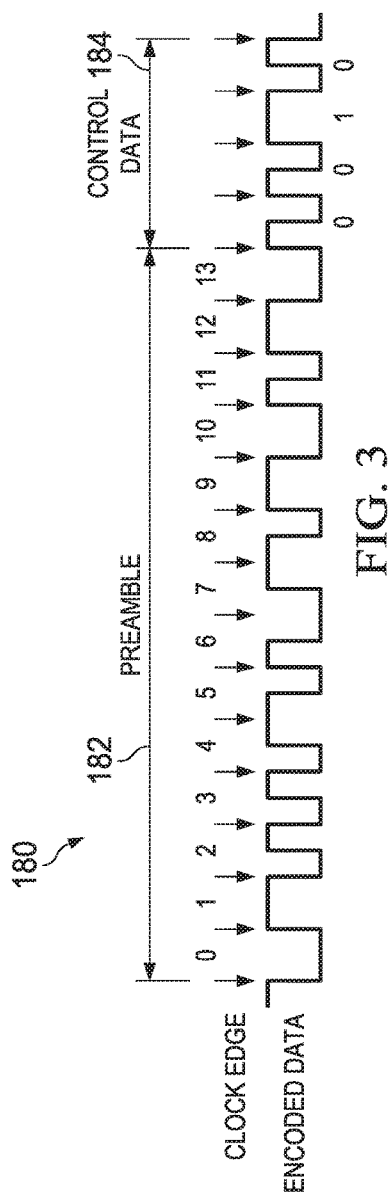
FIG. 3 is a diagram of a portion of a synchronization control frame used for communication in the system of FIG. 1, in accordance with various embodiments.

FIG. 3 is a diagram of a portion of a synchronization control frame 180 used for communication in the system 100, in accordance with various embodiments. In particular, the synchronization control frame 180 may be used for data clock recovery and PLL synchronization, as discussed below. As noted above, because communications over the bus 106 may occur in both directions, communications may be time-multiplexed into downstream portions and upstream portions. In a downstream portion, a synchronization control frame and downstream data may be transmitted from the master node 102, while in an upstream portion, a synchronization response frame, and upstream data may be transmitted to the master node 102 from each of the slave nodes 104. The synchronization control frame 180 may include a preamble 182 and control data 184. Each slave node 104 may be configured to use the preamble 182 of the received synchronization control frame 180 as a time base for feeding the PLL 128. To facilitate this, a preamble 182 does not follow the "rules" of valid control data 184, and thus can be readily distinguished from the control data 184.

Figure 5:
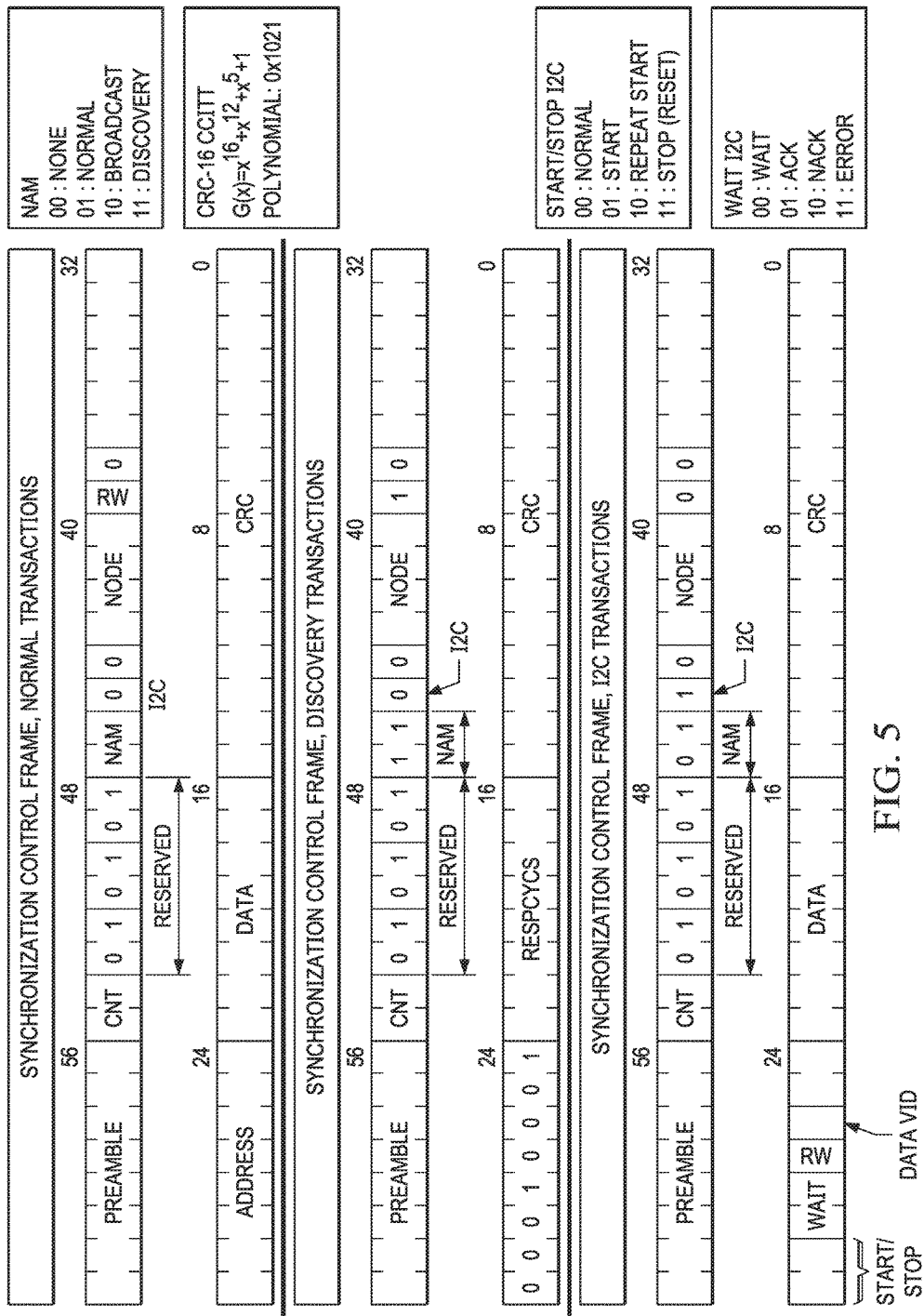
FIG. 5 illustrates example formats for a synchronization control frame in different modes of operation of the system of FIG. 1, in accordance with various embodiments.

For example, in some embodiments, communication along the bus 106 may be encoded using a clock first, transition on zero differential Manchester coding scheme. According to such an encoding scheme, each bit time begins with a clock transition. If the data value is zero, the encoded signal transitions again in the middle of the bit time. If the data value is one, the encoded signal does not transition again. The preamble 182 illustrated in FIG. 5 may violate the encoding protocol (e.g., by having clock transitions that do not occur at the beginning of bit times 5, 7, and 8), which means that the preamble 182 may not match any legal (e.g., correctly encoded) pattern for the control data 184. In addition, the preamble 182 cannot be reproduced by taking a legal pattern for the control data 184 and forcing the bus 106 HIGH or LOW for a single bit time or for a multiple bit time period. The preamble 182 illustrated in FIG. 5 is simply illustrative, and the synchronization control frame 180 may include different preambles 182 that may violate the encoding used by the control data 184 in any suitable manner.

The bus protocol circuitry 126 may include differential Manchester decoder circuitry that runs on a clock recovered from the bus 106 and that detects the synchronization control frame 180 to send a frame sync indicator to the PLL 128. In this manner, the synchronization control frame 180 may be detected without using a system clock or a higher-speed oversampling clock. Consequently, the slave nodes 104 can receive a PLL synchronization signal from the bus 106 without requiring a crystal clock source at the slave nodes 104.

Figure 4:
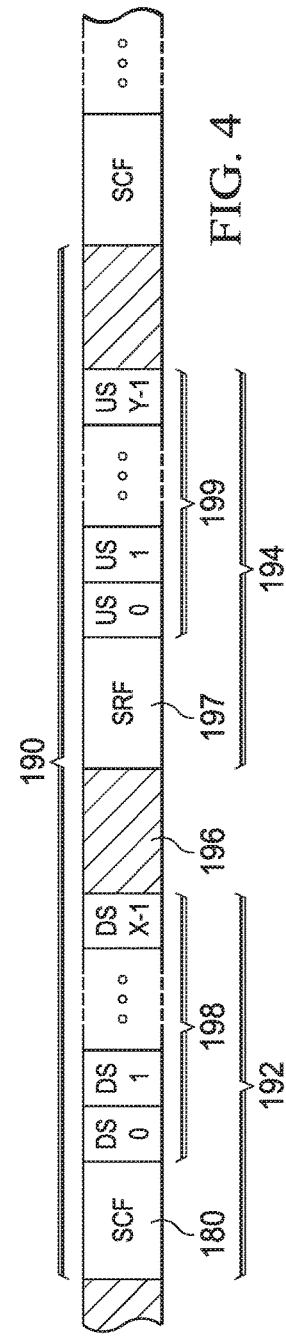
FIG. 4 is a diagram of a superframe used for communication in the system of FIG. 1, in accordance with various embodiments.
Figure 6A:
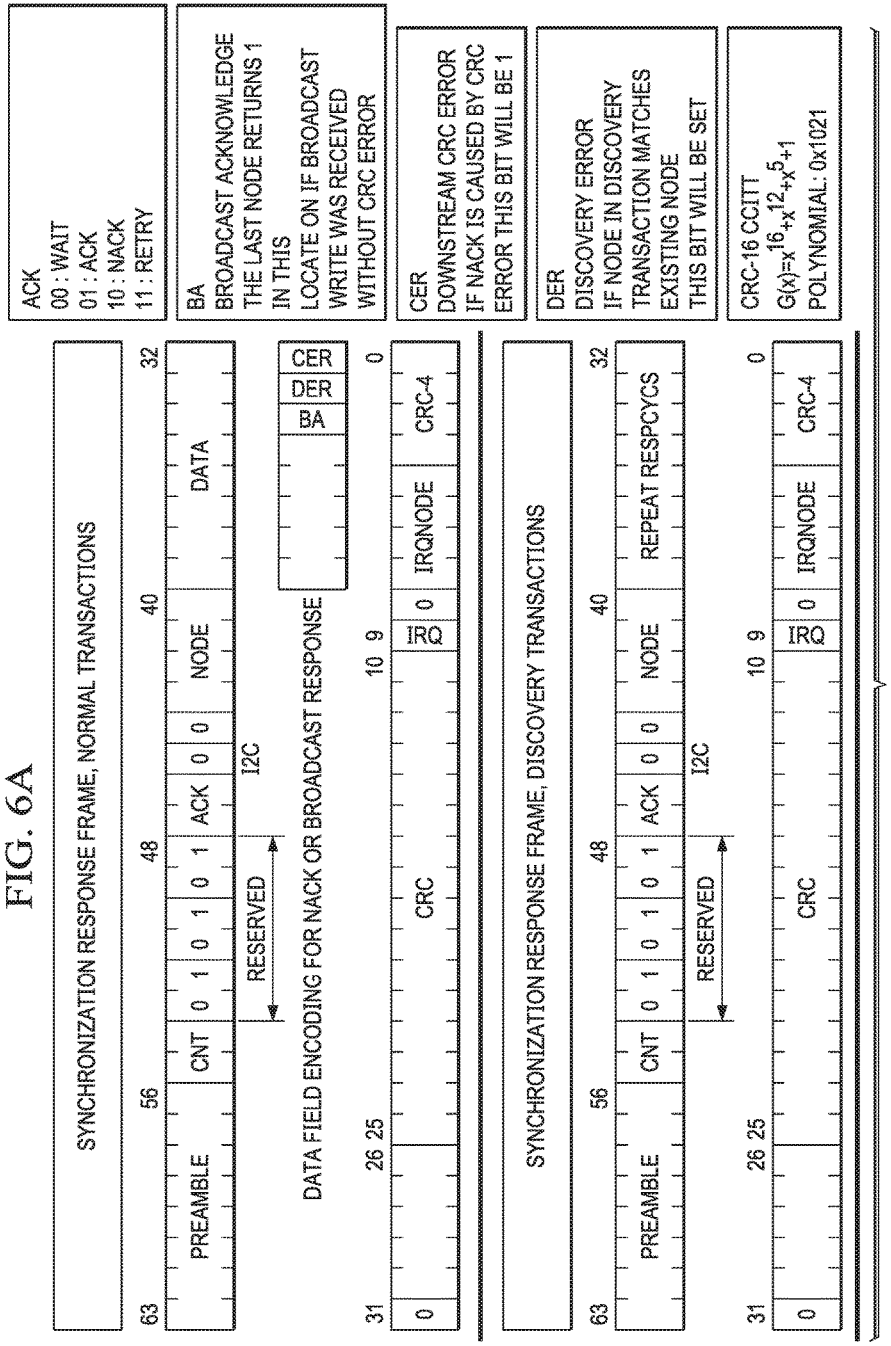
FIGS. 6A-6B collectively illustrate example formats for a synchronization response frame at different modes of operation of the system of FIG. 1, in accordance with various embodiments.
Figure 6B:
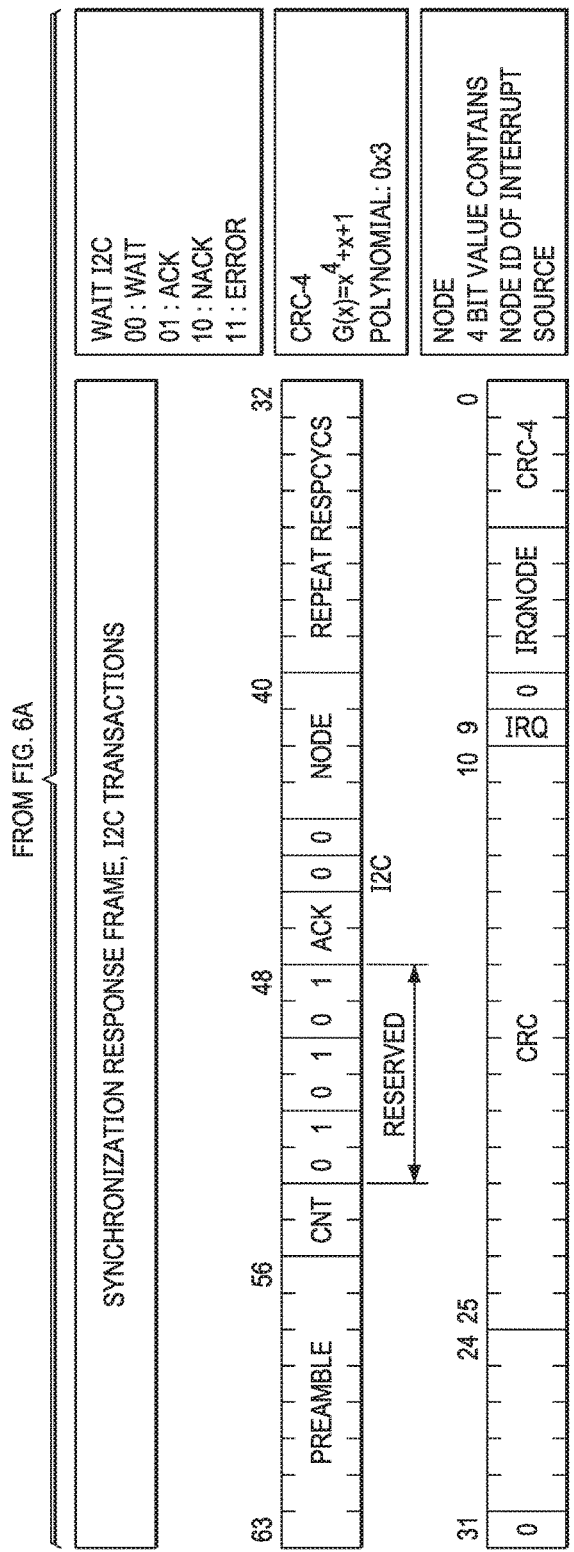

As noted above, communications along the bus 106 may occur in periodic superframes. FIG. 4 is a diagram of a superframe 190, in accordance with various embodiments. As shown in FIGS. 6A-6B, a superframe may begin with a synchronization control frame 180. When the synchronization control frame 180 is used as a timing source for the PLL 128, the frequency at which superframes are communicated ("the superframe frequency") may be the same as the synchronization signal frequency. In some embodiments in which audio data is transmitted along the bus 106, the superframe frequency may be the same as the audio sampling frequency used in the system 100 (e.g., either 48 kHz or 44.1 kHz), but any suitable superframe frequency may be used. Each superframe 190 may be divided into periods of downstream transmission 192, periods of upstream transmission 194, and periods of no transmission 196 (e.g., when the bus 106 is not driven).

In FIG. 4, the superframe 190 is shown with an initial period of downstream transmission 192 and a later period of upstream transmission 194. The period of downstream transmission 192 may include a synchronization control frame 180 and X downstream data slots 198, where X can be zero. Substantially all signals on the bus 106 may be line-coded and a synchronization signal forwarded downstream from the master node 102 to the last slave node 104 (e.g., the slave node 104C) in the form of the synchronization preamble 182 in the synchronization control frame 180, as discussed above. Downstream, TDM, synchronous data may be included in the X downstream data slots 198 after the synchronization control frame 180. The downstream data slots 198 may have equal width. As discussed above, the PLL 128 may provide the clock that a node uses to time communications over the bus 106. In some embodiments in which the bus 106 is used to transmit audio data, the PLL 128 may operate at a multiple of the audio sampling frequency (e.g., 1024 times the audio sampling frequency, resulting in 1024-bit clocks in each superframe).

The period of upstream transmission 194 may include a synchronization response frame 197 and Y upstream data slots 199, where Y can be zero. In some embodiments, each slave node 104 may consume a portion of the downstream data slots 198. The last slave node (e.g., slave node 2 in FIG. 1) may respond (after a predetermined response time stored in a register of the last slave node) with a synchronization response frame 197. Upstream, TDM, synchronous data may be added by each slave node 104 in the upstream data slots 199 directly after the synchronization response frame 197. The upstream data slots 199 may have equal width. A slave node 104 that is not the last slave node (e.g., the slave nodes 0 and 1 in FIG. 1) may replace the received synchronization response frame 197 with its own upstream response if a read of one of its registers was requested in the synchronization control frame 180 of the superframe 190 or if a remote I2C read was requested in the synchronization control frame 180 of the superframe 190.

As discussed above, the synchronization control frame 180 may begin each downstream transmission. In some embodiments, the synchronization control frame 180 may be 64 bits in length, but any other suitable length may be used. The synchronization control frame 180 may begin with the preamble 182, as noted above. In some embodiments, when the synchronization control frame 180 is retransmitted by a slave node 104 to a downstream slave node 104, the preamble 182 may be generated by the transmitting slave node 104, rather than being retransmitted.

The control data 184 of the synchronization control frame 180 may include fields that contain data used to control transactions over the bus 106. Examples of these fields are discussed below, and some embodiments are illustrated in FIG. 5. In particular, FIG. 5 illustrates example formats for the synchronization control frame 180 in normal mode, I2C mode, and discovery mode, in accordance with various embodiments. In some embodiments, a different preamble 182 or synchronization control frame 180 entirely may be used in standby mode so that the slave nodes 104 do not need to receive all of the synchronization control frame 180 until a transition to normal mode is sent.

In some embodiments, the synchronization control frame 180 may include a count (CNT) field. The CNT field may have any suitable length (e.g., 2 bits) and may be incremented (modulo the length of the field) from the value used in the previous superframe. A slave node 104 that receives a CNT value that is unexpected may be programmed to return an interrupt.

In some embodiments, the synchronization control frame 180 may include a node addressing mode (NAM) field. The NAM field may have any suitable length (e.g., 2 bits) and may be used to control access to registers of a slave node 104 over the bus 106. In normal mode, registers of a slave node 104 may be read from and/or written to based on the ID of the slave node 104 and the address of the register. Broadcast transactions are writes which should be taken by every slave node 104. In some embodiments, the NAM field may provide for four node addressing modes, including "none" (e.g., data not addressed to any particular slave node 104), "normal" (e.g., data unicast to a specific slave node 104 specified in the address field discussed below), "broadcast" (e.g., addressed to all slave nodes 104), and "discovery."

In some embodiments, the synchronization control frame 180 may include an I2C field. The I2C field may have any suitable length (e.g., 1 bit) and may be used to indicate that the period of downstream transmission 192 includes an I2C transaction. The I2C field may indicate that the host 110 has provided instructions to remotely access a peripheral device 108 that acts as an I2C slave with respect to an associated slave node 104.

In some embodiments, the synchronization control frame 180 may include a node field. The node field may have any suitable length (e.g., 4 bits) and may be used to indicate which slave node is being addressed for normal and I2C accesses. In discovery mode, this field may be used to program an identifier for a newly discovered slave node 104 in a node ID register of the slave node 104. Each slave node 104 in the system 100 may be assigned a unique ID when the slave node 104 is discovered by the master node 102, as discussed below. In some embodiments, the master node 102 does not have a node ID, while in other embodiments, the master node 102 may have a node ID. In some embodiments, the slave node 104 attached to the master node 102 on the bus 106 (e.g., the slave node 0 in FIG. 1) will be slave node 0, and each successive slave node 104 will have a number that is 1 higher than the previous slave node. However, this is simply illustrative, and any suitable slave node identification system may be used.

In some embodiments, the synchronization control frame 180 may include a read/write (RW) field. The RW field may have any suitable length (e.g., 1 bit) and may be used to control whether normal accesses are reads (e.g., RW=1) or writes (e.g., RW=0).

In some embodiments, the synchronization control frame 180 may include an address field. The address field may have any suitable length (e.g., 8 bits) and may be used to address specific registers of a slave node 104 through the bus 106. For I2C transactions, the address field may be replaced with I2C control values, such as START/STOP, WAIT, RW, and DATA VLD. For discovery transactions, the address field may have a predetermined value (e.g., as illustrated in FIG. 5).

In some embodiments, the synchronization control frame 180 may include a data field. The data field may have any suitable length (e.g., 8 bits) and may be used for normal, I2C, and broadcast writes. The RESPCYCS value, multiplied by 4, may be used to determine how many cycles a newly discovered node should allow to elapse between the start of the synchronization control frame 180 being received and the start of the synchronization response frame 197 being transmitted. When the NAM field indicates discovery mode, the node address and data fields discussed below may be encoded as a RESPCYCS value that, when multiplied by a suitable optional multiplier (e.g., 4), indicates the time, in bits, from the end of the synchronization control frame 180 to the start of the synchronization response frame 197. This allows a newly discovered slave node 104 to determine the appropriate time slot for upstream transmission.

In some embodiments, the synchronization control frame 180 may include a cyclic redundancy check (CRC) field. The CRC field may have any suitable length (e.g., 16 bits) and may be used to transmit a CRC value for the control data 184 of the synchronization control frame 180 following the preamble 182. In some embodiments, the CRC may be calculated in accordance with the CCITT-CRC error detection scheme.

In some embodiments, at least a portion of the synchronization control frame 180 between the preamble 182 and the CRC field may be scrambled in order to reduce the likelihood that a sequence of bits in this interval will periodically match the preamble 182 (and thus may be misinterpreted by the slave node 104 as the start of a new superframe 190), as well as to reduce electromagnetic emissions as noted above. In some such embodiments, the CNT field of the synchronization control frame 180 may be used by scrambling logic to ensure that the scrambled fields are scrambled differently from one superframe to the next. Various embodiments of the system 100 described herein may omit scrambling.

Other techniques may be used to ensure that the preamble 182 can be uniquely identified by the slave nodes 104 or to reduce the likelihood that the preamble 182 shows up elsewhere in the synchronization control frame 180, in addition to or in lieu of techniques such as scrambling and/or error encoding as discussed above. For example, a longer synchronization sequence may be used so as to reduce the likelihood that a particular encoding of the remainder of the synchronization control frame 180 will match it. Additionally or alternatively, the remainder of the synchronization control frame may be structured so that the synchronization sequence cannot occur, such as by placing fixed "0" or "1" values at appropriate bits.

The master node 102 may send read and write requests to the slave nodes 104, including both requests specific to communication on the bus 106 and I2C requests. For example, the master node 102 may send read and write requests (indicated using the RW field) to one or more designated slave nodes 104 (using the NAM and node fields) and can indicate whether the request is a request for the slave node 104 specific to the bus 106, an I2C request for the slave node 104, or an I2C request to be passed along to an I2C-compatible peripheral device 108 coupled to the slave node 104 at one or more I2C ports of the slave node 104.

Turning to upstream communication, the synchronization response frame 197 may begin each upstream transmission. In some embodiments, the synchronization response frame 197 may be 64 bits in length, but any other suitable length may be used. The synchronization response frame 197 may also include a preamble, as discussed above with reference to the preamble 182 of the synchronization control frame 180, followed by data portion. At the end of a downstream transmission, the last slave node 104 on the bus 106 may wait until the RESPCYCS counter has expired and then begin transmitting a synchronization response frame 197 upstream. If an upstream slave node 104 has been targeted by a normal read or write transaction, a slave node 104 may generate its own synchronization response frame 197 and replace the one received from downstream. If any slave node 104 does not see a synchronization response frame 197 from a downstream slave node 104 at the expected time, the slave node 104 will generate its own synchronization response frame 197 and begin transmitting it upstream.

The data portion of the synchronization response frame 197 may include fields that contain data used to communicate response information back to the master node 102. Examples of these fields are discussed below, and some embodiments are illustrated in FIGS. 6A-6B. In particular, FIGS. 6A-6B illustrate example formats for the synchronization response frame 197 in normal mode, I2C mode, and discovery mode, in accordance with various embodiments.

In some embodiments, the synchronization response frame 197 may include a count (CNT) field. The CNT field may have any suitable length (e.g., 2 bits) and may be used to transmit the value of the CNT field in the previously received synchronization control frame 180.

In some embodiments, the synchronization response frame 197 may include an acknowledge (ACK) field. The ACK field may have any suitable length (e.g., 2 bits), and may be inserted by a slave node 104 to acknowledge a command received in the previous synchronization control frame 180 when that slave node 104 generates the synchronization response frame 197. Example indicators that may be communicated in the ACK field include wait, acknowledge, not acknowledge (NACK), and retry. In some embodiments, the ACK field may be sized to transmit an acknowledgment by a slave node 104 that it has received and processed a broadcast message (e.g., by transmitting a broadcast acknowledgment to the master node 102). In some such embodiments, a slave node 104 also may indicate whether the slave node 104 has data to transmit (which could be used, for example, for demand-based upstream transmissions, such as non-TDM inputs from a keypad or touchscreen, or for prioritized upstream transmission, such as when the slave node 104 wishes to report an error or emergency condition).

In some embodiments, the synchronization response frame 197 may include an I2C field. The I2C field may have any suitable length (e.g., 1 bit) and may be used to transmit the value of the I2C field in the previously received synchronization control frame 180.

In some embodiments, the synchronization response frame 197 may include a node field. The node field may have any suitable length (e.g., 4 bits) and may be used to transmit the ID of the slave node 104 that generates the synchronization response frame 197.

In some embodiments, the synchronization response frame 197 may include a data field. The data field may have any suitable length (e.g., 8 bits), and its value may depend on the type of transaction and the ACK response of the slave node 104 that generates the synchronization response frame 197. For discovery transactions, the data field may include the value of the RESPCYCS field in the previously received synchronization control frame 180. When the ACK field indicates a NACK, or when the synchronization response frame 197 is responding to a broadcast transaction, the data field may include a broadcast acknowledge (BA) indicator (in which the last slave node 104 may indicate if the broadcast write was received without error), a discovery error (DER) indicator (indicating whether a newly discovered slave node 104 in a discovery transaction matches an existing slave node 104), and a CRC error (CER) indicator (indicating whether a NACK was caused by a CRC error).

In some embodiments, the synchronization response frame 197 may include a CRC field. The CRC field may have any suitable length (e.g., 16 bits) and may be used to transmit a CRC value for the portion of the synchronization response frame 197 between the preamble and the CRC field.

In some embodiments, the synchronization response frame 197 may include an interrupt request (IRQ) field. The IRQ field may have any suitable length (e.g., 1 bit) and may be used to indicate that an interrupt has been signaled from a slave node 104.

In some embodiments, the synchronization response frame 197 may include an IRQ node (IRQNODE) field. The IRQNODE field may have any suitable length (e.g., 4 bits) and may be used to transmit the ID of the slave node 104 that has signaled the interrupt presented by the IRQ field. In some embodiments, the slave node 104 for generating the IRQ field will insert its own ID into the IRQNODE field.

In some embodiments, the synchronization response frame 197 may include a second CRC (CRC-4) field. The CRC-4 field may have any suitable length (e.g., 4 bits) and may be used to transmit a CRC value for the IRQ and IRQNODE fields.

In some embodiments, the synchronization response frame 197 may include an IRQ field, an IRQNODE field, and a CRC-4 field as the last bits of the synchronization response frame 197 (e.g., the last 10 bits). As discussed above, these interrupt-related fields may have their own CRC protection in the form of CRC-4 (and thus not protected by the preceding CRC field). Any slave node 104 that needs to signal an interrupt to the master node 102 will insert its interrupt information into these fields. In some embodiments, a slave node 104 with an interrupt pending may have higher priority than any slave node 104 further downstream that also has an interrupt pending. The last slave node 104 along the bus 106 (e.g., the slave node 2 in FIG. 1) may always populate these interrupt fields. If the last slave node 104 has no interrupt pending, the last slave node 104 may set the IRQ bit to 0, the IRQNODE field to its node ID, and provide the correct CRC-4 value. For convenience, a synchronization response frame 197 that conveys an interrupt may be referred to herein as an "interrupt frame."

In some embodiments, at least a portion of the synchronization response frame 197 between the preamble 182 and the CRC field may be scrambled in order to reduce emissions. In some such embodiments, the CNT field of the synchronization response frame 197 may be used by scrambling logic to ensure that the scrambled fields are scrambled differently from one superframe to the next. Various embodiments of the system 100 described herein may omit scrambling.

Other techniques may be used to ensure that the preamble 182 can be uniquely identified by the slave nodes 104 or to reduce the likelihood that the preamble 182 shows up elsewhere in the synchronization response frame 197, in addition to or in lieu of techniques such as scrambling and/or error encoding as discussed above. For example, a longer synchronization sequence may be used so as to reduce the likelihood that a particular encoding of the remainder of the synchronization response frame 180 will match it. Additionally or alternatively, the remainder of the synchronization response frame may be structured so that the synchronization sequence cannot occur, such as by placing fixed "0" or "1" values at appropriate bits.

Figure 7:
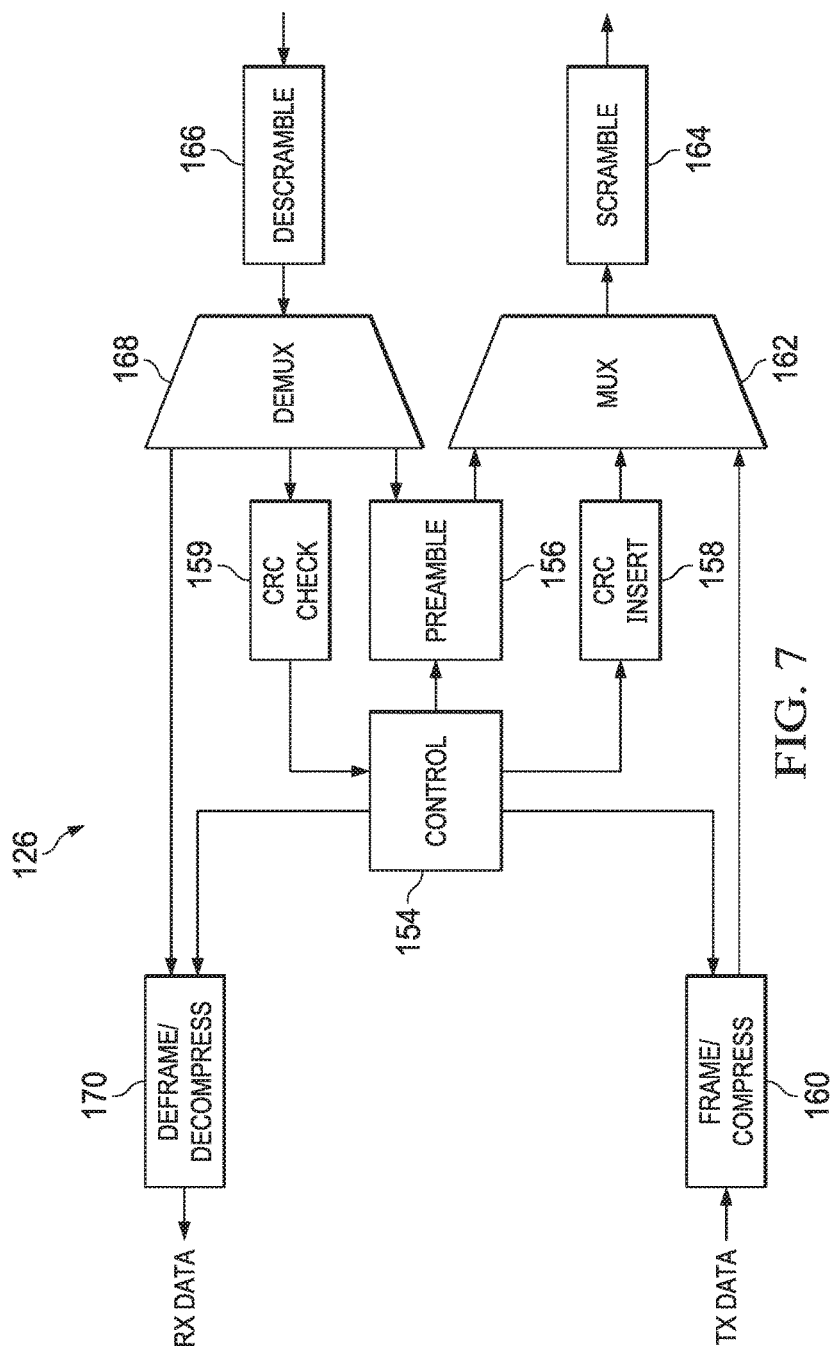
FIG. 7 is a block diagram of various components of the bus protocol circuitry of FIG. 2, in accordance with various embodiments.

FIG. 7 is a block diagram of the bus protocol circuitry 126 of FIG. 2, in accordance with various embodiments. The bus protocol circuitry 126 may include control circuitry 154 to control the operation of the node transceiver 120 in accordance with the protocol for the bus 106 described herein. In particular, the control circuitry 154 may control the genera-tion of synchronization frames for transmission (e.g., synchronization control frames or synchronization response frames, as discussed above), the processing of received synchronization frames, and the performance of control operations specified in received synchronization control frames. The control circuitry 154 may include programmable registers, as discussed below. The control circuitry 154 may create and receive synchronization control frames, react appropriately to received messages (e.g., associated with a synchronization control frame when the bus protocol circuitry 126 is included in a slave node 104 or from an I2C device when the bus protocol circuitry 126 is included in a master node 102), and adjust the framing to the different operational modes (e.g., normal, discovery, standby, etc.).

When the node transceiver 120 is preparing data for transmission along the bus 106, preamble circuitry 156 may be configured to generate preambles for synchronization frames for transmission, and to receive preambles from received synchronization frames. In some embodiments, a downstream synchronization control frame preamble may be sent by the master node 102 every 1024 bits. As discussed above, one or more slave nodes 104 may synchronize to the downstream synchronization control frame preamble and generate local, phase-aligned master clocks from the preamble.

Cyclic redundancy check (CRC) insert circuitry 158 may be configured to generate one or more CRCs for synchronization frames for transmission. Frame/compress circuitry 160 may be configured to take incoming data from the I2S/TDM/PDM transceiver 127 (e.g., from a frame buffer associated with the transceiver 127) and/or the I2C transceiver 129, optionally compress the data, and optionally generate parity check bits or error correction codes (ECC) for the data. A multiplexer (MUX) 162 may multiplex a preamble from the preamble circuitry 156, synchronization frames, and data into a stream for transmission. In some embodiments, the transmit stream may be scrambled by scrambling circuitry 164 before transmission.

For example, in some embodiments, the frame/compress circuitry 160 may apply a floating point compression scheme. In such an embodiment, the control circuitry 154 may transmit 3 bits to indicate how many repeated sign bits are in the number, followed by a sign bit and N−4 bits of data, where N is the size of the data to be transmitted over the bus 106. The use of data compression may be configured by the master node 102 when desired.

In some embodiments, the receive stream entering the node transceiver 120 may be descrambled by the descrambling circuitry 166. A demultiplexer (DEMUX) 168 may demultiplex the preamble, synchronization frames, and data from the receive stream. CRC check circuitry 159 on the receive side may check received synchronization frames for the correct CRC. When the CRC check circuitry 159 identifies a CRC failure in an incoming synchronization control frame 180, the control circuitry 154 may be notified of the failure and will not perform any control commands in the control data 184 of the synchronization control frame 180. When the CRC check circuitry 159 identifies a CRC failure in an incoming synchronization response frame 197, the control circuitry 154 may be notified of the failure and may generate an interrupt for transmission to the host 110 in an interrupt frame. Deframe/decompress circuitry 170 may accept receive data, optionally check its parity, optionally perform error detection and correction (e.g., single error correction—double error detection (SECDED)), optionally decompress the data, and may write the receive data to the I2S/TDM/PDM transceiver 127 (e.g., a frame buffer associated with the transceiver 127) and/or the I2C transceiver 129.

As discussed above, upstream and downstream data may be transmitted along the bus 106 in TDM data slots within a superframe 190. The control circuitry 154 may include registers dedicated to managing these data slots on the bus 106, a number of examples of which are discussed below. When the control circuitry 154 is included in a master node 102, the values in these registers may be programmed into the control circuitry 154 by the host 110. When the control circuitry 154 is included in a slave node 104, the values in these registers may be programmed into the control circuitry 154 by the master node 102.

In some embodiments, the control circuitry 154 may include a downstream slots (DNSLOTS) register. When the node transceiver 120 is included in the master node 102, this register may hold the value of the total number of downstream data slots. This register may also define the number of data slots that will be used for combined I2S/TDM/PDM receive by the I2S/TDM/PDM transceiver 127 in the master node 102. In a slave node 104, this register may define the number of data slots that are passed downstream to the next slave node 104 before or after the addition of locally generated downstream slots, as discussed in further detail below with reference to LDNSLOTS.

In some embodiments, the control circuitry 154 may include a local downstream slots (LDNSLOTS) register. This register may be unused in the master node 102. In a slave node 104, this register may define the number of data slots that the slave node 104 will use and not retransmit. Alternatively, this register may define the number of slots that the slave node 104 may contribute to the downstream bus link 106.

In some embodiments, the control circuitry 154 may include an upstream slots (UPSLOTS) register. In the master node 102, this register may hold the value of the total number of upstream data slots. This register may also define the number of slots that will be used for I2S/TDM transmit by the I2S/TDM/PDM transceiver 127 in the master node 102. In a slave node 104, this register may define the number of data slots that are passed upstream before the slave node 104 begins to add its own data.

In some embodiments, the control circuitry 154 may include a local upstream slots (LUPSLOTS) register. This register may be unused in the master node 102. In a slave node 104, this register may define the number of data slots that the slave node 104 will add to the data received from downstream before it is sent upstream. This register may also define the number of data slots that will be used for combined I2S/TDM/PDM receive by the I2S/TDM/PDM transceiver 127 in the slave node 104.

In some embodiments, the control circuitry 154 may include a broadcast downstream slots (BCDNSLOTS) register. This register may be unused in the master node 102. In a slave node 104, this register may define the number of broadcast data slots. In some embodiments, broadcast data slots may always come at the beginning of the data field. The data in the broadcast data slots may be used by multiple slave nodes 104 and may be passed downstream by all slave nodes 104 whether or not they are used.

In some embodiments, the control circuitry 154 may include a slot format (SLOTFMT) register. This register may define the format of data for upstream and downstream transmissions. The data size for the I2S/TDM/PDM transceiver 127 may also be determined by this register. In some embodiments, valid data sizes include 8, 12, 16, 20, 24, 28, and 32 bits. This register may also include bits to enable floating point compression for downstream and upstream traffic. When floating point compression is enabled, the I2S/TDM data size may be 4 bits larger than the data size over the bus 106. All nodes in the system 100 may have the same values for SLOTFMT when data slots are enabled, and the nodes may be programmed by a broadcast write so that all nodes will be updated with the same value.

FIGS. 8-11 illustrate examples of information exchange along the bus 106, in accordance with various embodiments of the bus protocols described herein. In particular, FIGS. 8-11 illustrate embodiments in which each slave node 104 is coupled to one or more speakers and/or one or more microphones as the peripheral device 108. This is simply illustrative, as any desired arrangement of peripheral device 108 may be coupled to any particular slave node 104 in accordance with the techniques described herein.

Figure 8:
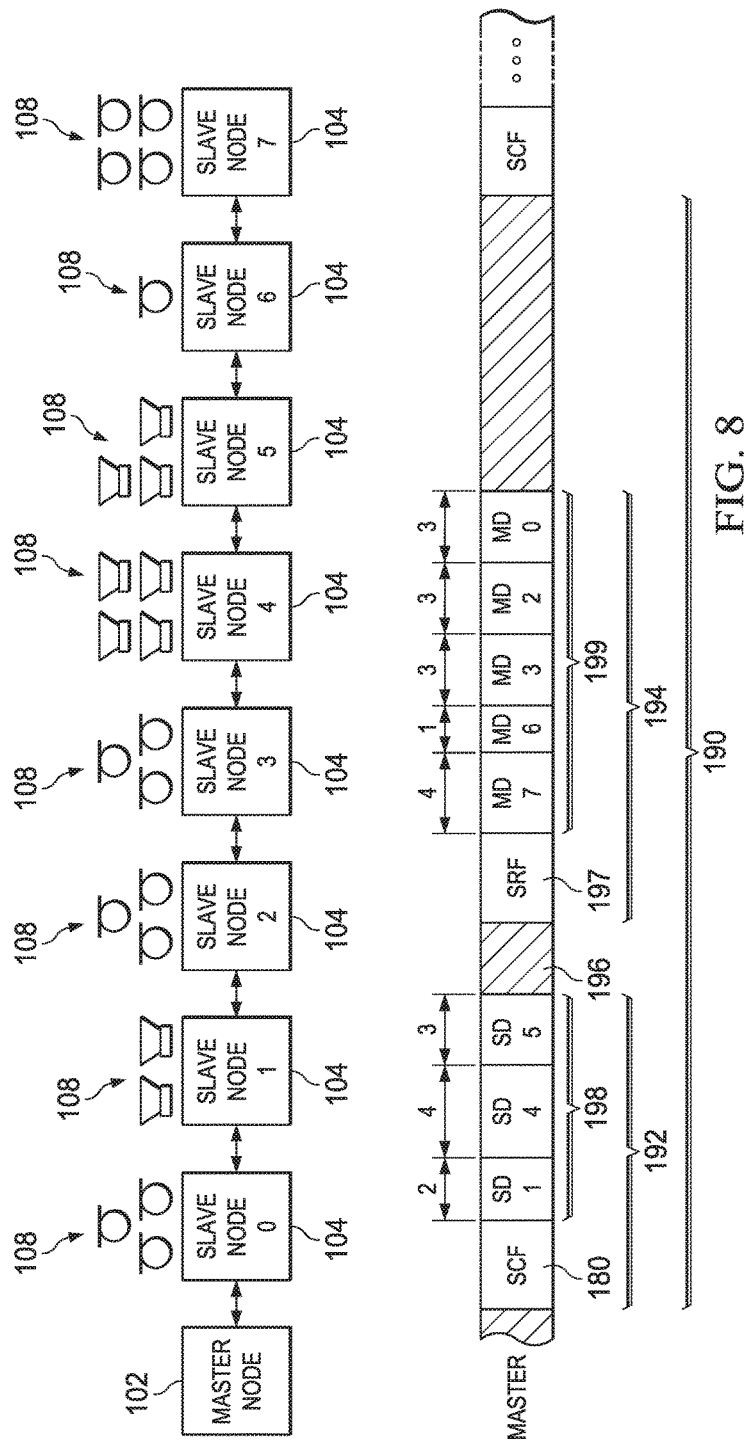
FIGS. 8-11 illustrate examples of information exchange along a two-wire bus, in accordance with various embodiments of the bus protocols described herein.

To begin, FIG. 8 illustrates signaling and timing considerations for bi-directional communication on the bus 106, in accordance with various embodiments. The slave nodes 104 depicted in FIG. 8 have various numbers of sensor/actuator elements, and so different amounts of data may be sent to, or received from, the various slave nodes 104. Specifically, slave node 1 has two elements, slave node 4 has four elements, and slave node 5 has three elements, so the data transmitted by the master node 102 includes two time slots for slave node 1, four time slots for slave node 4, and three time slots for slave node 5. Similarly, slave node 0 has three elements, slave node 2 has three elements, slave node 3 has three elements, slave node 6 has one element, and slave node 7 has four elements, so the data transmitted upstream by those slave nodes 104 includes the corresponding number of time slots. It should be noted that there need not have to be a one-to-one correlation between elements and time slots. For example, a microphone array, included in the peripheral device 108, having three microphones may include a digital signal processor that combines signals from the three microphones (and possibly also information received from the master node 102 or from other slave nodes 104) to produce a single data sample, which, depending on the type of processing, could correspond to a single time slot or multiple time slots.

In FIG. 8, the master node 102 transmits a synchronization control frame (SCF) followed by data for speakers coupled to specific slave nodes 104 (SD). Each successive slave node 104 forwards the synchronization control frame and also forwards at least any data destined for downstream slave nodes 104. A particular slave node 104 may forward all data or may remove data destined for that slave node 104. When the last slave node 104 receives the synchronization control frame, that slave node 104 transmits the synchronization response frame (SRF) optionally followed by any data that the slave node 104 is permitted to transmit. Each successive slave node 104 forwards the synchronization response frame along with any data from downstream slave nodes 104 and optionally inserts data from one or more microphones coupled to the particular slave nodes 104 (MD). In the example of FIG. 8, the master node 102 sends data to slave nodes 1, 4, and 5 (depicted in FIG. 8 as active speakers) and receives data from slave nodes 7, 6, 3, 2, and 0 (depicted in FIG. 8 as microphone arrays).

Figure 9:
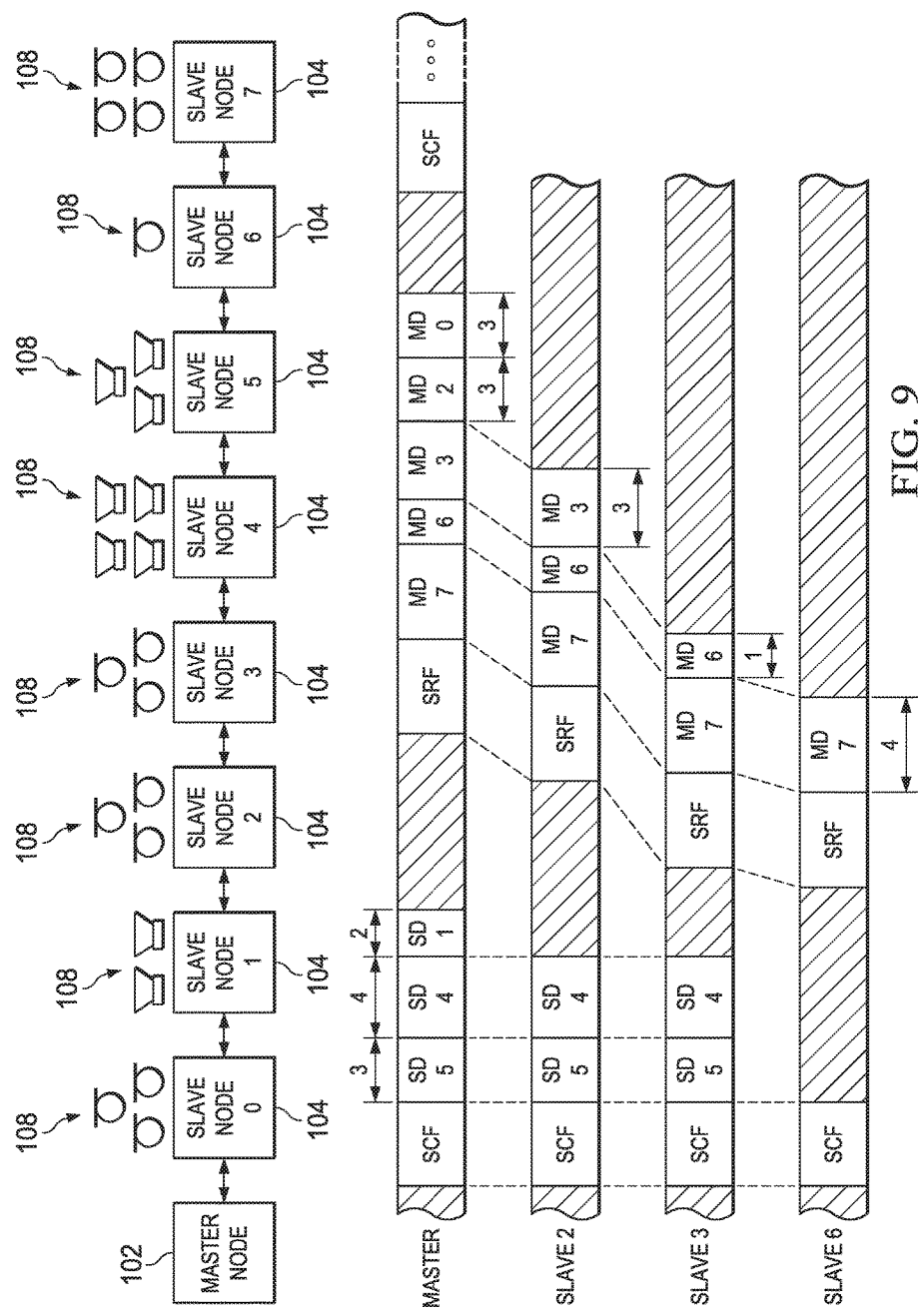

FIG. 9 schematically illustrates the dynamic removal of data from a downstream transmission and insertion of data into an upstream transmission, from the perspective of the downstream DS transceiver 124, in accordance with various embodiments. In FIG. 9, as in FIG. 8, the master node 102 transmits a synchronization control frame (SCF) followed by data for slave nodes 1, 4, and 5 (SD) in reverse order (e.g., data for slave node 5 is followed by data for slave node 4, which is followed by data for slave node 1, etc.) (see the row labeled MASTER). When slave node 1 receives this transmission, slave node 1 removes its own data and forwards to slave node 2 only the synchronization control frame followed by the data for slave nodes 5 and 4. Slave nodes 2 and 3 forward the data unchanged (see the row labeled SLAVE 2), such that the data forwarded by slave node 1 is received by slave node 4 (see the row labeled SLAVE 3). Slave node 4 removes its own data and forwards to slave node 5 only the synchronization control frame followed by the data for slave node 5, and, similarly, slave node 5 removes its own data and forwards to slave node 6 only the synchronization control frame. Slave node 6 forwards the synchronization control frame to slave node 7 (see the row labeled SLAVE 6).

At this point, slave node 7 transmits to slave node 6 the synchronization response frame (SRF) followed by its data (see the row labeled SLAVE 6). Slave node 6 forwards to slave node 5 the synchronization response frame along with the data from slave node 7 and its own data, and slave node 5 in turn forwards to slave node 4 the synchronization response frame along with the data from slave nodes 7 and 6. Slave node 4 has no data to add, so it simply forwards the data to slave node 3 (see the row labeled SLAVE 3), which forwards the data along with its own data to slave node 2 (see the row labeled SLAVE 2), which in turn forwards the data along with its own data to slave node 1. Slave node 1 has no data to add, so it forwards the data to slave node 0, which forwards the data along with its own data. As a result, the master node 102 receives the synchronization response frame followed by the data from slave nodes 7, 6, 3, 2, and 0 (see the row labeled MASTER).

Figure 10:
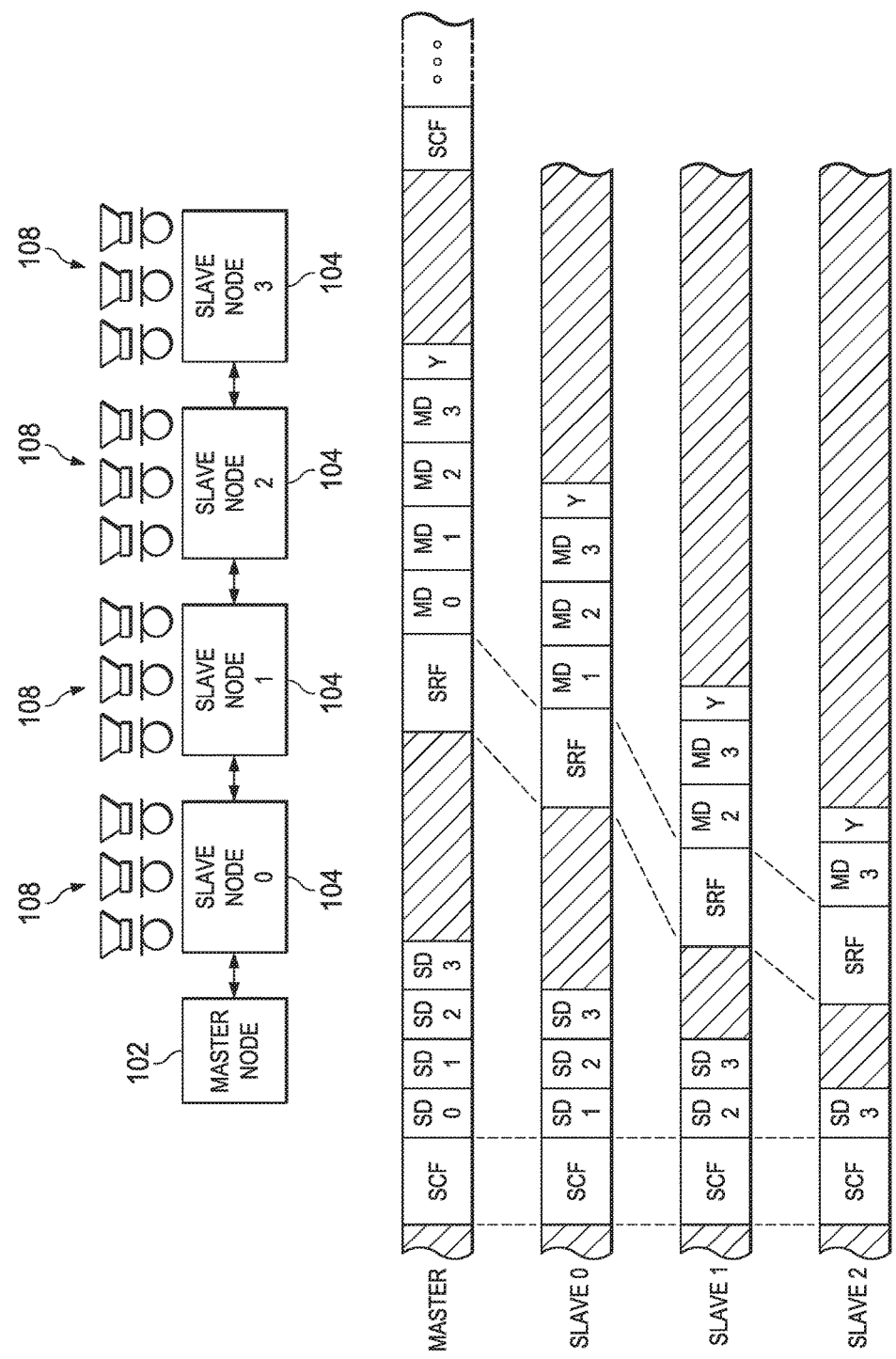

FIG. 10 illustrates another example of the dynamic removal of data from a downstream transmission and insertion of data into an upstream transmission, from the perspective of the downstream DS transceiver 124, as in FIG. 9, although in FIG. 10, the slave nodes 104 are coupled with both sensors and actuators as the peripheral device 108 such that the master node 102 sends data downstream to all of the slave nodes 104 and receives data back from all of the slave nodes 104. Also, in FIG. 10, the data is ordered based on the node address to which it is destined or from which it originates. The data slot labeled "Y" may be used for a data integrity check or data correction.

Figure 11:
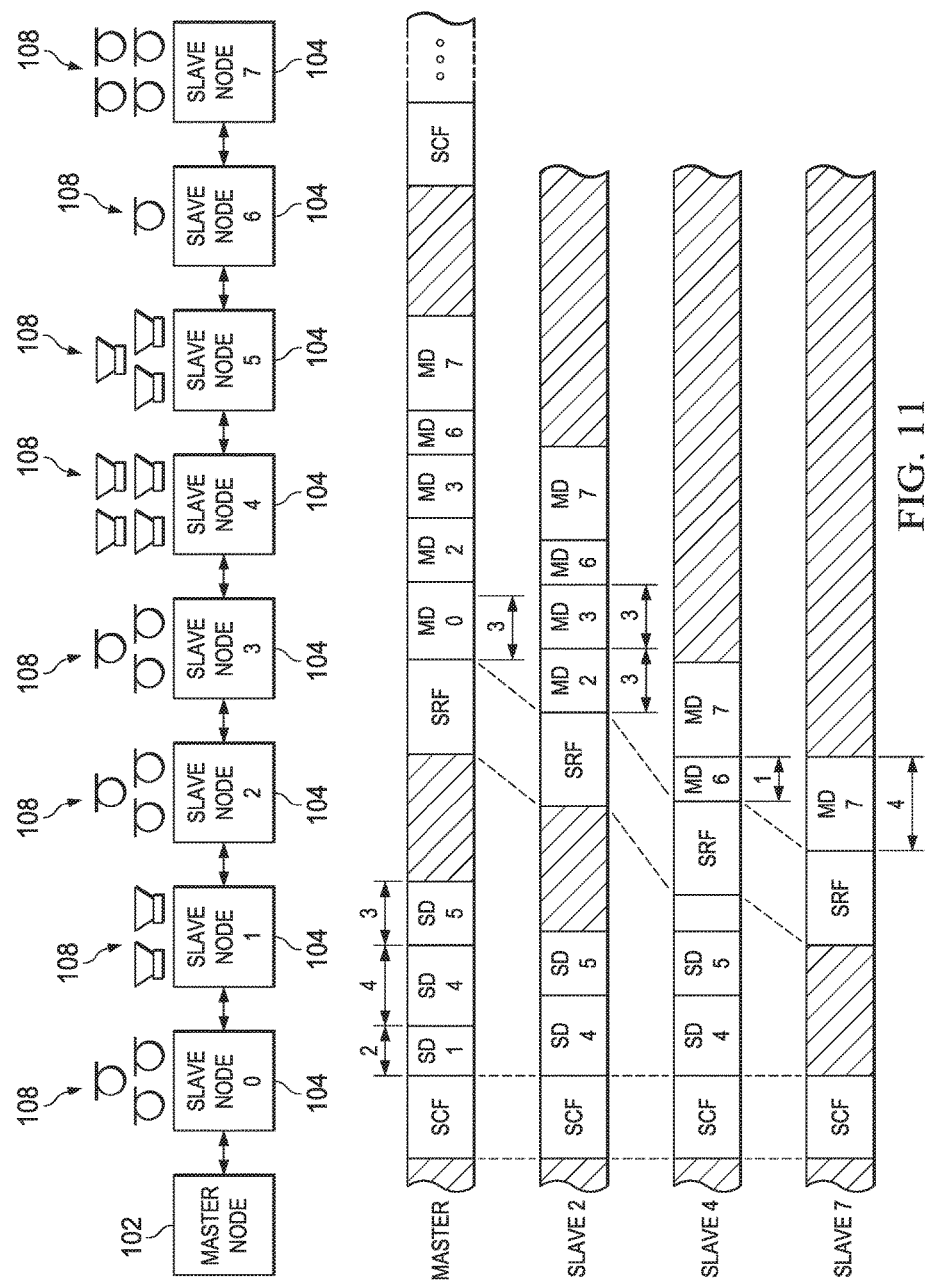

FIG. 11 illustrates another example of the dynamic removal of data from a downstream transmission and insertion of data into an upstream transmission, from the perspective of the downstream DS transceiver 124, as in FIG. 9, although in FIG. 11, the data is conveyed downstream and upstream in sequential order rather than reverse order. Buffering at each slave node 104 allows for selectively adding, removing, and/or forwarding data.

As discussed above, each slave node 104 may remove data from downstream or upstream transmissions and/or may add data to downstream or upstream transmissions. Thus, for example, the master node 102 may transmit a separate sample of data to each of a number of slave nodes 104, and each such slave node 104 may remove its data sample and forward only data intended for downstream slaves. On the other hand, a slave node 104 may receive data from a downstream slave node 104 and forward the data along with additional data. One advantage of transmitting as little information as needed is to reduce the amount of power consumed collectively by the system 100.

The system 100 may also support broadcast transmissions (and multicast transmissions) from the master node 102 to the slave nodes 104, specifically through configuration of the downstream slot usage of the slave nodes 104. Each slave node 104 may process the broadcast transmission and pass it along to the next slave node 104, although a particular slave node 104 may "consume" the broadcast message, (i.e., not pass the broadcast transmission along to the next slave node 104).

The system 100 may also support upstream transmissions (e.g., from a particular slave node 104 to one or more other slave nodes 104). Such upstream transmissions can include unicast, multicast, and/or broadcast upstream transmissions. With upstream addressing, as discussed above with reference to downstream transmissions, a slave node 104 may determine whether or not to remove data from an upstream transmission and/or whether or not to pass an upstream transmission along to the next upstream slave node 104 based on configuration of the upstream slot usage of the slave nodes 104. Thus, for example, data may be passed by a particular slave node 104 to one or more other slave nodes 104 in addition to, or in lieu of, passing the data to the master node 102. Such slave-slave relationships may be configured, for example, via the master node 102.

Thus, in various embodiments, the slave nodes 104 may operate as active/intelligent repeater nodes, with the ability to selectively forward, drop, and add information. The slave nodes 104 may generally perform such functions without necessarily decoding/examining all of the data, since each slave node 104 knows the relevant time slot(s) within which it will receive/transmit data, and hence can remove data from or add data into a time slot. Notwithstanding that the slave nodes 104 may not need to decode/examine all data, the slave nodes 104 may typically re-clock the data that it transmits/forwards. This may improve the robustness of the system 100.

Figure 12:
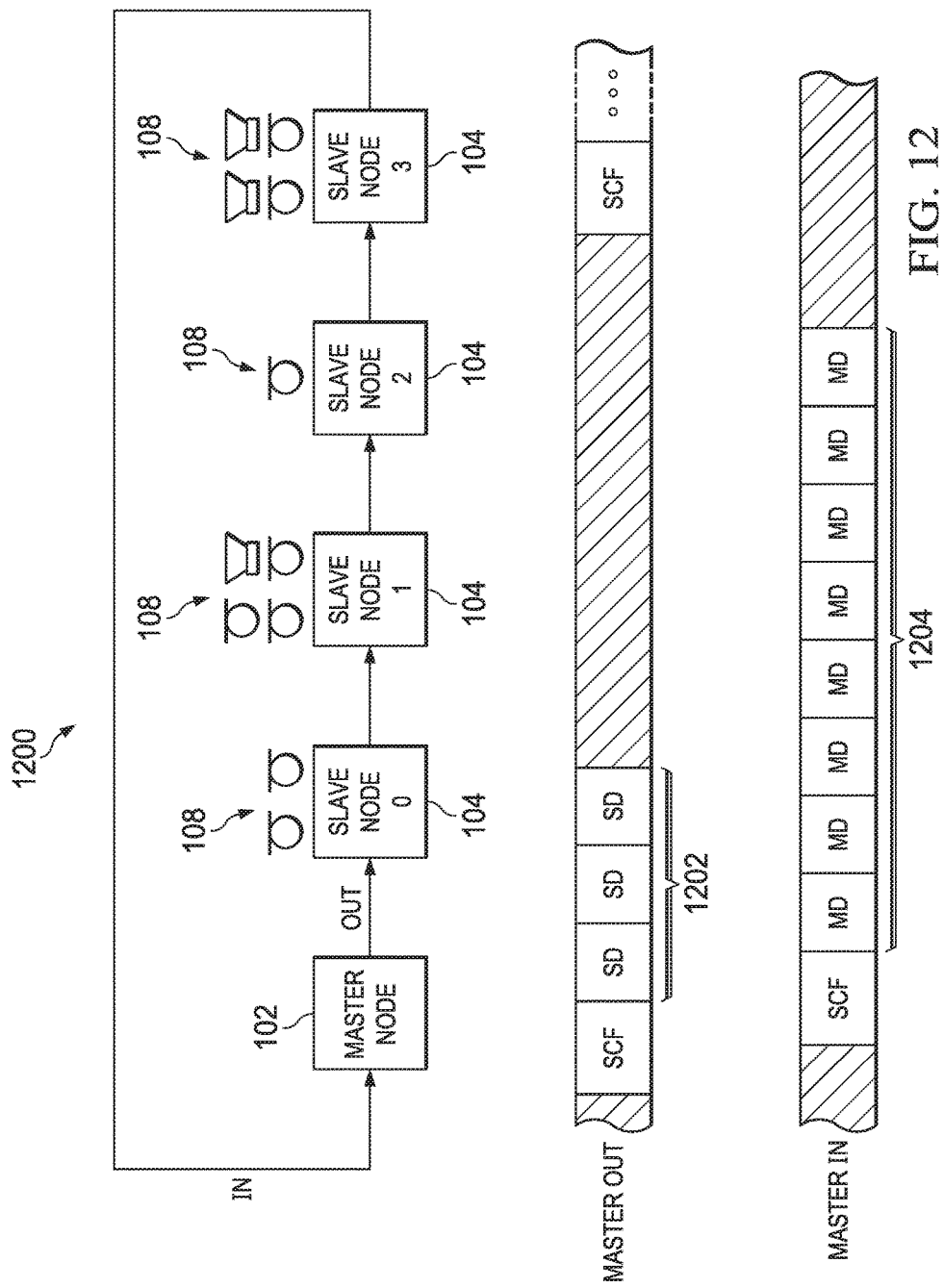
FIG. 12 illustrates a ring topology for the two-wire bus and a unidirectional communication scheme thereon, in accordance with various embodiments.

In some embodiments, the bus 106 may be configured for unidirectional communications in a ring topology. For example, FIG. 12 illustrates an arrangement 1200 of the master node 102 and four slave nodes 104 in a ring topology, and illustrates signaling and timing considerations for unidirectional communication in the arrangement 1200, in accordance with various embodiments. In such embodiments, the node transceivers 120 in the nodes may include a receive-only transceiver (MASTER IN) and a transmit-only transceiver (MASTER OUT), rather than two bi-directional transceivers for upstream and downstream communication. In the link-layer synchronization scheme illustrated in FIG. 12, the master node 102 transmits a synchronization control frame (SCF) 180, optionally followed by "downstream" data 1202 for the three speakers coupled to various slave nodes 104 (the data for the different speakers may be arranged in any suitable order, as discussed above with reference to FIGS. 8-11), and each successive slave node 104 forwards the synchronization control frame 180 along with any "upstream" data from prior slave nodes 104 and "upstream" data of its own to provide "upstream" data 1204 (e.g., the data from the eight different microphones may be arranged in any suitable order, as discussed above with reference to FIGS. 8-11).

As described herein, data may be communicated between elements of the system 100 in any of a number of ways. In some embodiments, data may be sent as part of a set of synchronous data slots upstream (e.g., using the data slots 199) by a slave node 104 or downstream (e.g., using the data slots 198) by a slave node 104 or a master node 102. The volume of such data may be adjusted by changing the number of bits in a data slot, or including extra data slots. Data may also be communicated in the system 100 by inclusion in a synchronization control frame 180 or a synchronization response frame 197. Data communicated this way may include I2C control data from the host 110 (with a response from a peripheral device 108 associated with a slave node 104); accesses to registers of the slave nodes 104 (e.g., for discovery and configuration of slots and interfaces) that may include write access from the host 110/master node 102 to a slave node 104 and read access from a slave node 104 to the host 110/master node 102; and event signaling via interrupts from a peripheral device 108 to the host 110. In some embodiments, GPIO pins may be used to convey information from a slave node 104 to the master node 102 (e.g., by having the master node 102 poll the GPIO pins over I2C, or by having a node transceiver 120 of a slave node 104 generate an interrupt at an interrupt request pin). For example, in some such embodiments, a host 110 may send information to the master node 102 via I2C, and then the master node 102 may send that information to the slave via the GPIO pins. Any of the types of data discussed herein as transmitted over the bus 106 may be transmitted using any one or more of these communication pathways. Other types of data and data communication techniques within the system 100 may be disclosed herein.

Figure 13:
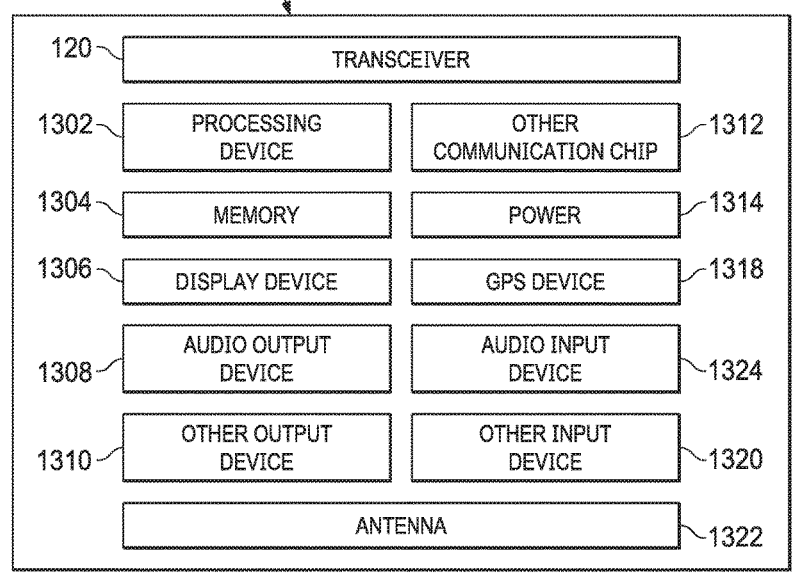
FIG. 13 schematically illustrates a device that may serve as a node or host in the system of FIG. 1, in accordance with various embodiments.

Embodiments of the present disclosure may be implemented into a system using any suitable hardware and/or software to configure as desired. FIG. 13 schematically illustrates a device 1300 that may serve as a host or a node (e.g., a host 110, a master node 102, or a slave node 104) in the system 100, in accordance with various embodiments. A number of components are illustrated in FIG. 13 as included in the device 1300, but any one or more of these components may be omitted or duplicated, as suitable for the application.

Additionally, in various embodiments, the device 1300 may not include one or more of the components illustrated in FIG. 13, but the device 1300 may include interface circuitry for coupling to the one or more components. For example, the device 1300 may not include a display device 1306, but may include display device interface circuitry (e.g., a connector and driver circuitry) to which a display device 1306 may be coupled. In another set of examples, the device 1300 may not include an audio input device 1324 or an audio output device 1308, but may include audio input or output device interface circuitry (e.g., connectors and supporting circuitry) to which an audio input device 1324 or audio output device 1308 may be coupled.

The device 1300 may include the node transceiver 120, in accordance with any of the embodiments disclosed herein, for managing communication along the bus 106 when the device 1300 is coupled to the bus 106. The device 1300 may include a processing device 1302 (e.g., one or more processing devices), which may be included in the node transceiver 120 or separate from the node transceiver 120. As used herein, the term "processing device" may refer to any device or portion of a device that processes electronic data from registers and/or memory to transform that electronic data into other electronic data that may be stored in registers and/or memory. The processing device 1302 may include one or more digital signal processors (DSPs), application-specific integrated circuits (ASICs), central processing units (CPUs), graphics processing units (GPUs), cryptoprocessors, or any other suitable processing devices. The device 1300 may include a memory 1304, which may itself include one or more memory devices such as volatile memory (e.g., dynamic random access memory (DRAM)), non-volatile memory (e.g., read-only memory (ROM)), flash memory, solid state memory, and/or a hard drive.

In some embodiments, the memory 1304 may be employed to store a working copy and a permanent copy of programming instructions to cause the device 1300 to perform any suitable ones of the techniques disclosed herein. In some embodiments, machine-accessible media (including non-transitory computer-readable storage media), methods, systems, and devices for performing the above-described techniques are illustrative examples of embodiments disclosed herein for communication over a two-wire bus. For example, a computer-readable media (e.g., the memory 1304) may have stored thereon instructions that, when executed by one or more of the processing devices included in the processing device 1302, cause the device 1300 to perform any of the techniques disclosed herein.

In some embodiments, the device 1300 may include another communication chip 1312 (e.g., one or more other communication chips). For example, the communication chip 1312 may be configured for managing wireless communications for the transfer of data to and from the device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The communication chip 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The one or more communication chips 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The one or more communication chips 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The one or more communication chips 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1312 may operate in accordance with other wireless protocols in other embodiments. The device 1300 may include an antenna 1322 to facilitate wireless communications and/or to receive other wireless communications (such as AM or FM radio transmissions).

In some embodiments, the communication chip 1312 may manage wired communications using a protocol other than the protocol for the bus 106 described herein. Wired communications may include electrical, optical, or any other suitable communication protocols. Examples of wired communication protocols that may be enabled by the communication chip 1312 include Ethernet, controller area network (CAN), I2C, media-oriented systems transport (MOST), or any other suitable wired communication protocol.

As noted above, the communication chip 1312 may include multiple communication chips. For instance, a first communication chip 1312 may be dedicated to shorter-range wireless communications such as Wi-Fi or Bluetooth, and a second communication chip 1312 may be dedicated to longer-range wireless communications such as GPS, EDGE, GPRS, CDMA, WiMAX, LTE, EV-DO, or others. In some embodiments, a first communication chip 1312 may be dedicated to wireless communications, and a second communication chip 1312 may be dedicated to wired communications.

The device 1300 may include battery/power circuitry 1314. The battery/power circuitry 1314 may include one or more energy storage devices (e.g., batteries or capacitors) and/or circuitry for coupling components of the device 1300 to an energy source separate from the device 1300 (e.g., AC line power, voltage provided by a car battery, etc.). For example, the battery/power circuitry 1314 may include the upstream filtering circuitry 132 and the downstream filtering circuitry 131 discussed above with reference to FIG. 2 and could be charged by the bias on the bus 106.

The device 1300 may include a display device 1306 (or corresponding interface circuitry, as discussed above). The display device 1306 may include any visual indicators, such as a heads-up display, a computer monitor, a projector, a touchscreen display, a liquid crystal display (LCD), a light-emitting diode display, or a flat panel display, for example.

The device 1300 may include an audio output device 1308 (or corresponding interface circuitry, as discussed above). The audio output device 1308 may include any device that generates an audible indicator, such as speakers, headsets, or earbuds, for example.

The device 1300 may include an audio input device 1324 (or corresponding interface circuitry, as discussed above). The audio input device 1324 may include any device that generates a signal representative of a sound, such as microphones, microphone arrays, or digital instruments (e.g., instruments having a musical instrument digital interface (MIDI) output).

The device 1300 may include a global positioning system (GPS) device 1318 (or corresponding interface circuitry, as discussed above). The GPS device 1318 may be in communication with a satellite-based system and may receive a location of the device 1300, as known in the art.

The device 1300 may include another output device 1310 (or corresponding interface circuitry, as discussed above). Examples of the other output device 1310 may include an audio codec, a video codec, a printer, a wired or wireless transmitter for providing information to other devices, or an additional storage device. Additionally, any suitable ones of the peripheral devices 108 discussed herein may be included in the other output device 1310.

The device 1300 may include another input device 1320 (or corresponding interface circuitry, as discussed above). Examples of the other input device 1320 may include an accelerometer, a gyroscope, an image capture device, a keyboard, a cursor control device such as a mouse, a stylus, a touchpad, a bar code reader, a Quick Response (QR) code reader, or a radio frequency identification (RFID) reader. Additionally, any suitable ones of the sensors or peripheral devices 108 discussed herein may be included in the other input device 1320.

Any suitable ones of the display, input, output, communication, or memory devices described above with reference to the device 1300 may serve as the peripheral device 108 in the system 100. Alternatively or additionally, suitable ones of the display, input, output, communication, or memory devices described above with reference to the device 1300 may be included in a host (e.g., the host 110) or a node (e.g., a master node 102 or a slave node 104).

Figure 14A:
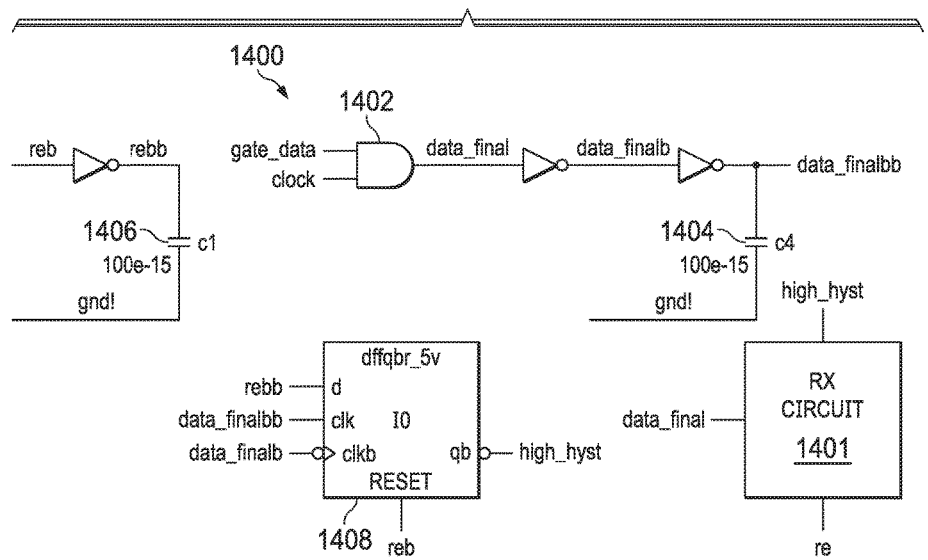
FIGS. 14A and 14B respectively illustrate schematic block diagrams circuits for implementing a DH technique in accordance with various embodiments.

FIG. 14A illustrates an embodiment of a circuit 1400 for use in implementing a DH technique in accordance with embodiments described herein. The DH technique may be implemented in connection with the system 100 described in detail above; however, it will be recognized that there are other system embodiments in which the DH technique described herein may be advantageously implemented.

It will be recognized that all comparators exhibit hysteresis, with hysteresis sometimes added intentionally to help robustness to input noise. Hysteresis through positive feedback changes the dynamics of the comparator. This may be especially observed when the input signal is on the order of the hysteresis voltage, which is called metastability and often leads to higher jitter.

In certain bus communications, such as in the system 100 described above, for a period of time in between data packets, a higher receive hysteresis may be helpful in rejecting any noise that the clock data recovery ("CDR") in the digital engine may misinterpret as real data. Once the first bit of the data packet is received, the CDR begins to lock to the data clock (i.e., the expected 0101 transitions). Thereafter and for the remainder of the packet, high receiver hysteresis is no longer necessary since the bus is now communicating and the CDR is locked. With a higher hysteresis, metastability may add an unnecessary amount of jitter.

The circuit 1400 generates a hysteresis control signal, designated "high_hyst", that is provided to a receiver circuit 1401 to set the hysteresis mode of the receiver circuit 1401. In certain embodiments, a HIGH high_hyst signal places the receiver circuit 1401 in a high hysteresis mode, whereas a LOW high_hyst signal places the receiver circuit in a low, or standard, hysteresis mode. As will be described in detail below, in operation, the circuit 1400 detects a first edge or transition of an incoming data signal. In the embodiment illustrated in FIG. 14A, the first transition is a LOW to HIGH (0 to 1) transition.

Figure 14B:
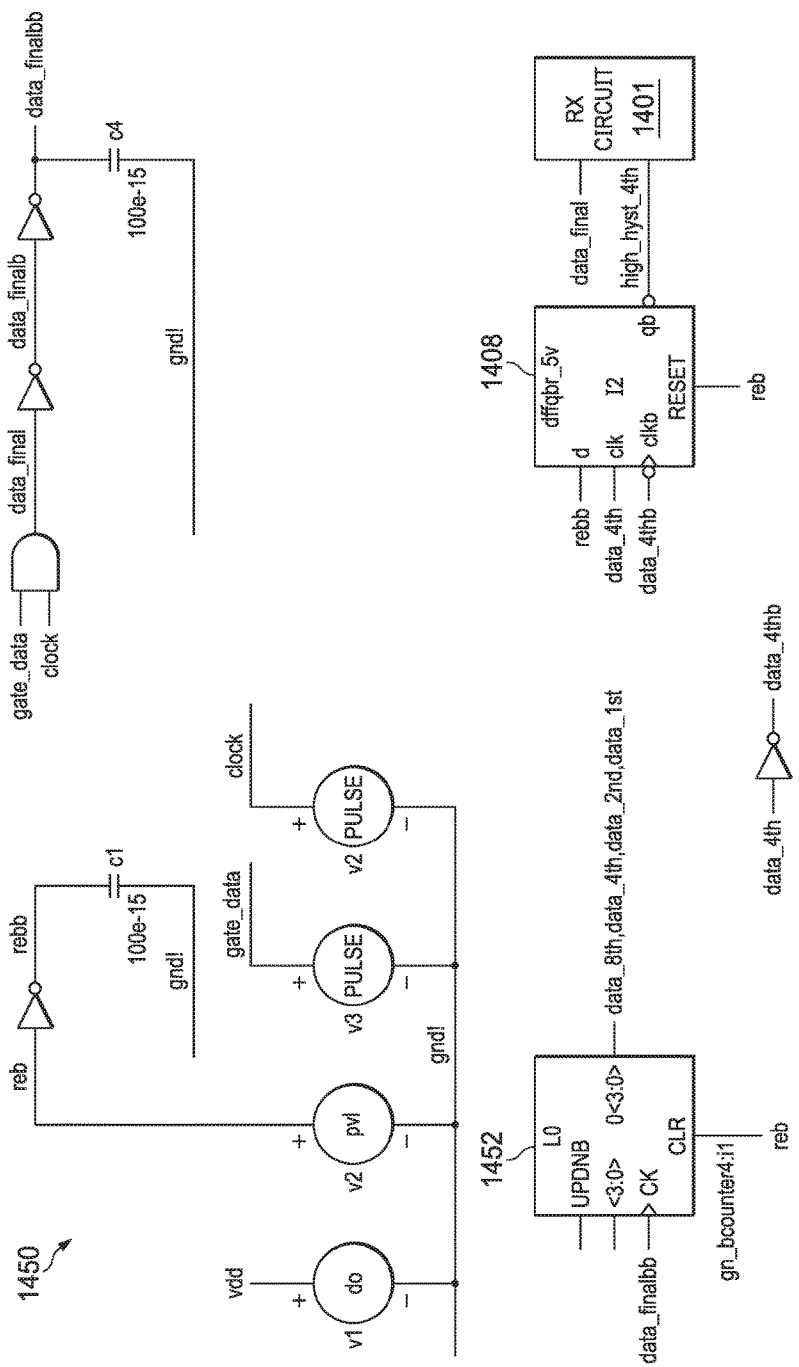

In certain embodiments, such as illustrated in FIG. 14B, a circuit 1450 for use in implementing a DH technique in accordance with embodiments described herein may include a counter to count the number of LOW to HIGH transitions so that a transition from one hysteresis mode to another could be programmed to occur after the Nth transition detected instead of after the first one It will be recognized that, although the circuit 1400 is designed to detect (and count) LOW to HIGH transitions, the circuit could be modified to detect (and count) HIGH to LOW transitions without impacting the spirit or scope of the embodiments described herein. Operation of the circuit 1400 will be described in greater detail with reference to FIG. 15A below. Similarly, operation of the circuit 1450 will be described in greater detail with reference to FIG. 15B below.

Figure 15A:
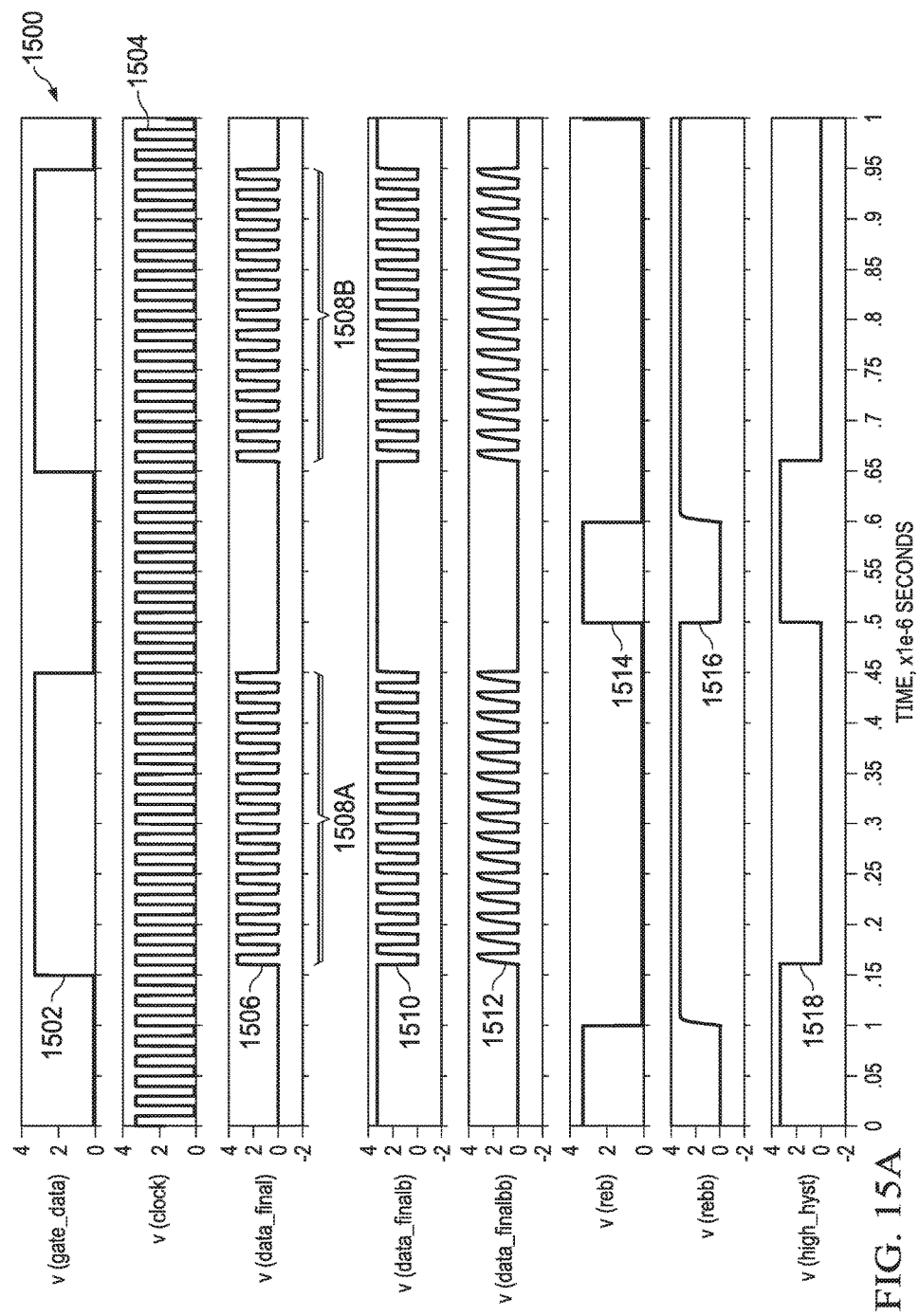

FIG. 15A illustrates a diagram 1500 of the waveforms of various signals of the circuit 1400 showing multiple transitions between a high hysteresis mode and a standard, lower hysteresis mode in accordance with various embodiments. As shown in FIGS. 14A and 15A, a gate_data signal (represented in FIG. 15A by a waveform 1502) and a clock signal (represented in FIG. 15A by a waveform 1504) are input to an AND gate 1402 to generate/model the data on the line ("data_final") (represented in FIG. 15A by a waveform 1506), two packets of which 1508A, 1508B, are illustrated in FIG. 15A. As shown in FIG. 15A, a data_finalb signal (represented in FIG. 15A by a waveform 1510) is the inverted version of the data_final signal. A data_finalbb signal (represented in FIG. 15A by a waveform 1512) is the delayed, via a capacitor 1404 (FIG. 14A), and inverted version of the data_final signal and a reb signal (represented in FIG. 15A by a waveform 1514) is the receiver BAR (active low) enable signal. When the reb signal is low, the receiver circuit 1401 is turned ON. A rebb signal (represented in FIG. 15 by a waveform 1516) is the delayed, via the addition of a capacitor 1406, and inverted version of the reb signal. As noted above, the high_hyst signal (represented in FIG. 15A by a waveform 1518) is the signal that sets the hysteresis mode. In the illustrated embodiment, when the high_hyst signal is HIGH, the receiver circuit 1401 is in high hysteresis mode; when the high_hyst signal is low, the receiver circuit 1401 is in low, or standard, hysteresis mode. As previously noted, although only two hysteresis modes are illustrated herein, more than two such modes may be advantageously implemented.

In the circuit 1400 of FIG. 14A, a D flip flop, or latch, 1408 is clocked by the data_finalbb signal to validate the first LOW to HIGH transition of the data is detected. Such detection sets the high_hyst (or hysteresis control) signal LOW, as the high_hyst signal is output from the inverted output ("Qb") of the latch 1408. The input of the latch 1408 is tied to the rebb signal, which is high when this occurs because the receiver circuit 1401 is enabled. The hysteresis control signal high_hyst goes HIGH again (i.e. is reset) when reb goes HIGH and the receiver circuit 1401 is disabled, or turned off, after the entire packet has been received. The high_hyst signal remains HIGH (and the receiver circuit 1401 remains in high hysteresis mode) until the next valid LOW to HIGH data transition, so the high_hyst signal is HIGH (and the receiver circuit 1401 is in high_hyst mode) when the receiver 1401 turns on again (the reb signal goes LOW) awaiting receipt of the next data packet. As a result, each time the reb signal is driven LOW by system protocols to enable the receiver circuit 1401, the receiver circuit will remain in high hysteresis mode until after the first (or Nth) LOW to HIGH data transition is detected. Once the first (or Nth) LOW to HIGH data transition is detected (using the circuit 1400), the high_hyst signal goes LOW (placing the receiver circuit 1401 in low, or normal, hysteresis mode, and remains there until the reb signal goes HIGH and the receiver circuit 1401 is again disabled. As a result, the circuit 1400 ensures that any noise on the line between the time the receiver circuit 1401 is turned on and the time the first data bit of an incoming packet is received is subject to a higher hysteresis, thus making the system more immune to noise.

Referring now to FIG. 14B, as illustrated therein, a counter 1452 is reset (pin CLR) to 0000 by a signal "reb" and is clocked (pin CLK) by the incoming data bit stream signal ("data_finalbb"). In one embodiment, the counter 1452 has a 1 ns delay and comprises a 4-bit counter, which enables a count from 0000 to 1111. For purposes of example, the counter 1452 is used to detect and then trigger the latch 1408 on the 4$^{th}$ incoming data bit (i.e., when the counter reaches 0100). As a result, the latch 1408 is clocked by data_4th and data_4thb. Out of reset, the latch 1408 is triggered by the 4$^{th}$ incoming data bit, setting high_hyst_4th high later than in the circuit 1400. The signal will remain high until the signal reb goes high again, after the receiver circuit 1401 is finished receiving. A timing diagram for various signals of the circuit 1450 is illustrated in FIG. 15B.

Various techniques for implementing high and standard, or low, hysteresis modes within the receiver circuit 1401 will now be described in greater detail. FIG. 16 illustrates an example of operation of high hysteresis mode in accordance with embodiments described herein. As shown in FIG. 16, a hystb signal, represented in FIG. 16 by a waveform 1600, is an inverted version of the hysteresis control signal high_hyst such that when high_hyst is HIGH, hystb is LOW and vice versa. In the illustrated embodiment, when the hystb signal is LOW (i.e., the high_hyst signal is HIGH and the receiver circuit 1401 (FIG. 14) is in high hysteresis mode), an output signal v(out), represented in FIG. 16 by a waveform 1602, does not trigger until a differential input voltage (i.e., the difference between v(ip), represented in FIG. 16 by a waveform 1604A, and v(in), represented in FIG. 16 by a waveform 1604B), reaches some predefined value (e.g., 10 mV). When the hystb signal 1600 is HIGH (i.e., the circuit is in standard hysteresis mode), the output signal triggers when the differential input voltage signal is much lower (e.g., approaching but not exactly 0 mV). As will be described in greater detail hereinbelow, a standard hysteresis of exactly 0 mV should be avoided to avoid metastability issues. As shown in FIG. 16, the hysteresis is symmetrical, meaning that the hysteresis for a LOW to HIGH transition is the same as that for a HIGH to LOW transition; however, it will be noted that, in accordance with features of embodiments described hereinbelow, an asymmetrical hysteresis may be implemented in which the hysteresis for a LOW to HIGH transition is different than that for a HIGH to LOW transition.

Figure 17A:
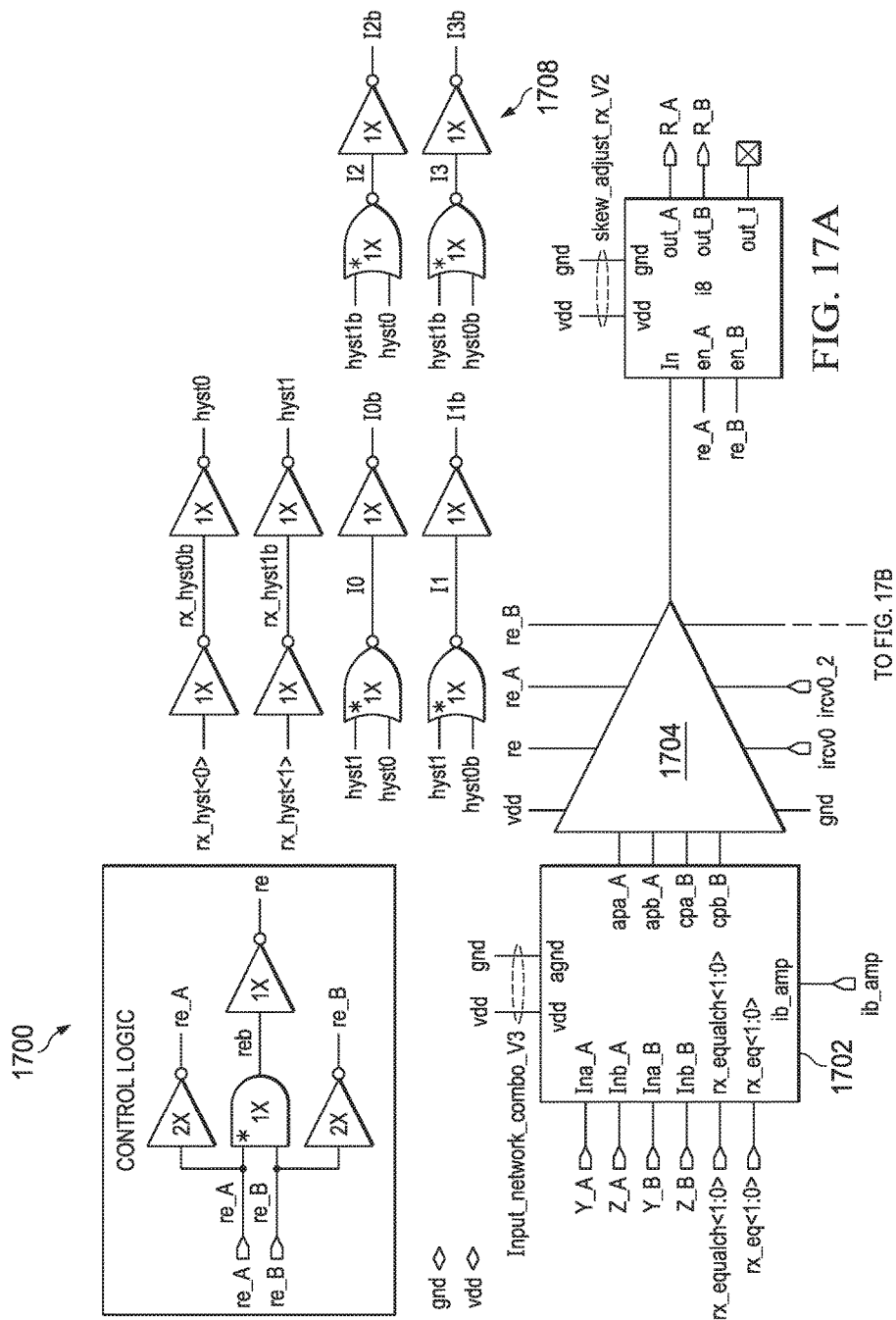

FIGS. 17A-17B are a more detailed high-level block diagram of a receiver circuit 1700, which in certain embodiments is identical to the receiver circuit 1401 (FIG. 14). As shown in FIGS. 17A-17B, the receiver circuit 1700 may include one or more of a resistive input network 1702, a comparator cell 1704, current control trim circuitry 1706, control logic 1708, a switch circuit 1709, and a timing skew cell 1710. As shown in FIGS. 17A-17B, the current control trim circuitry 1706 includes a plurality of switches for tuning the high hysteresis threshold.

Figure 18A:
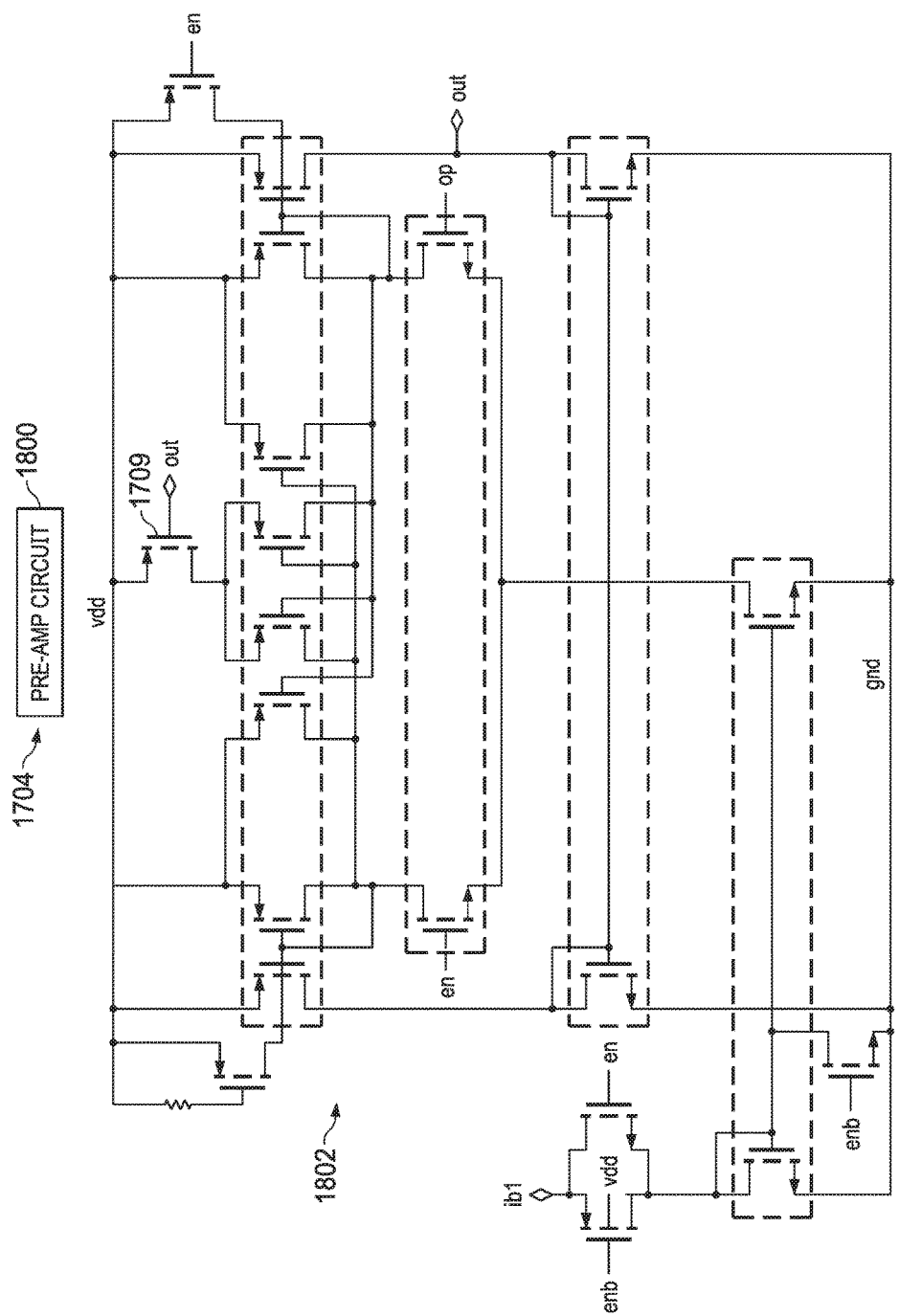
FIGS. 18A and 18B are a more detailed schematic block diagrams of a comparator of the receiver circuit of FIGS. 17A-17B in accordance with various embodiments.
Figure 18B:
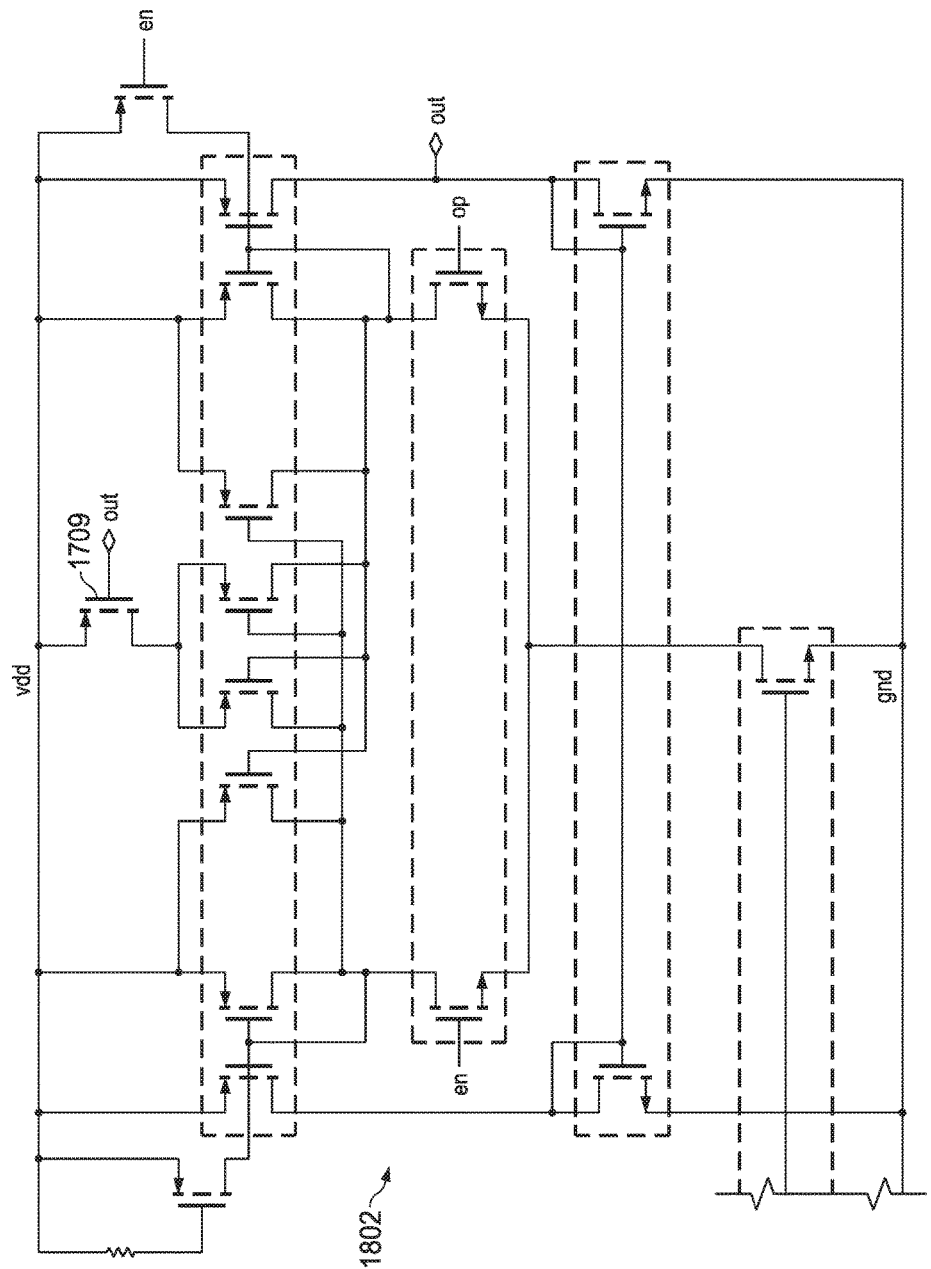

FIG. 18A is a more detailed schematic block diagram of the comparator cell 1704 of FIGS. 17A-17B. As shown in FIG. 18A, the comparator cell 1704 includes a first, or pre-amplifier ("pre-amp"), stage 1800 implemented using differential pairs of switches, and a comparator core 1802 in which standard and high hysteresis modes may be set. FIG. 18B is a variant schematic of the comparator cell 1704 of FIG. 18A.

A variety of techniques for implementing dynamic hysteresis in a receiver circuit, such as the receiver circuit 1700, may be implemented in accordance with embodiments described herein. Referring to FIG. 18B, one technique includes turning on extra additional units of cross-coupled devices in the comparator core 1802 via the enabling of a switch (e.g., switch 1709). The additional devices then appear essentially in parallel with the default cross-coupled devices, thereby ensuring that the positive feedback needs to be stronger, thus postponing the tipping point to a higher threshold. In other words, the additional cross-coupled devices increase the total number of cross-coupled devices in the comparator, thus requiring more current to be steered and overcome, which delays the trigger/switching point resulting in a higher hysteresis. This option allows for a coarser granularity higher hysteresis setting for implementing a single higher hysteresis. In accordance with features of embodiments described herein, the switch 1709 effectively functions as a variable resistor, the resistance of which is controlled by the voltage applied to the gate thereof, which in turn could be a current through a resistor or another device.

Figure 19A:
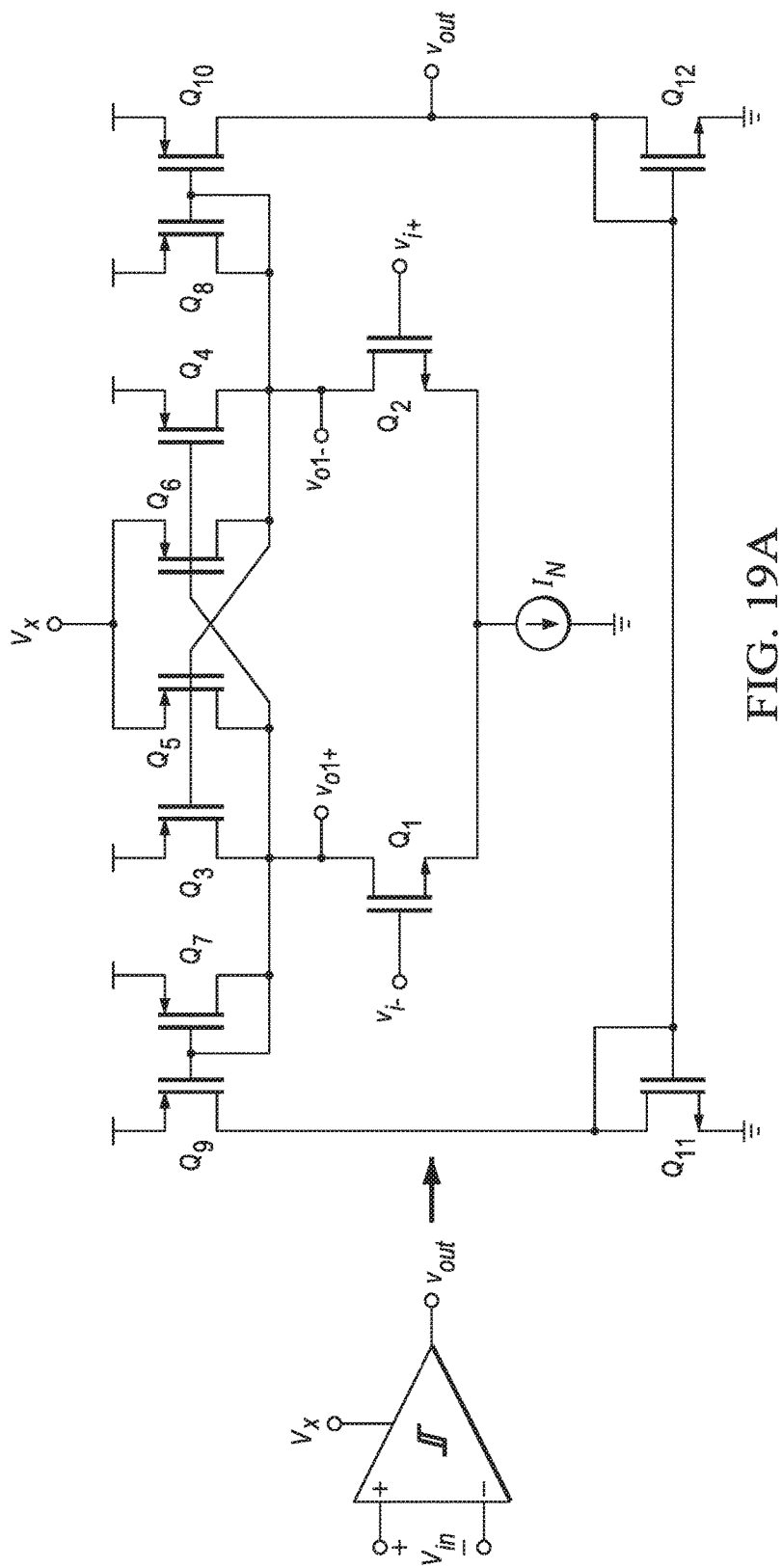
FIGS. 19A and 19B respectively illustrate more general schematic block diagrams of a core of the comparator of FIGS. 18A and 18B in accordance with various embodiments.

Referring to FIG. 19A, in a typical comparator, cross-coupled devices Q3 and Q4 are used to provide positive feedback for a standard (lower) hysteresis. In accordance with features of embodiments described herein, additional cross-coupled devices Q5 and Q6 are provided and controlled using a voltage Vx, which can change dynamically, subsequently increasing the hysteresis of the comparator depending on the value of Vx, which is tunable. In the embodiments illustrated herein, control of the voltage Vx is provided via the switch circuit 1709 (FIGS. 17A-17B). When enabled (i.e., when the high hysteresis control signal is HIGH), the switch circuit 1709 ties the extra devices Q5, Q6 to Vdd, allowing them to draw current therefrom. When disabled (i.e., when the high hysteresis control signal is LOW), the switch circuit 1709 isolates the extra devices Q5, Q6, from Vdd.

Figure 19B:
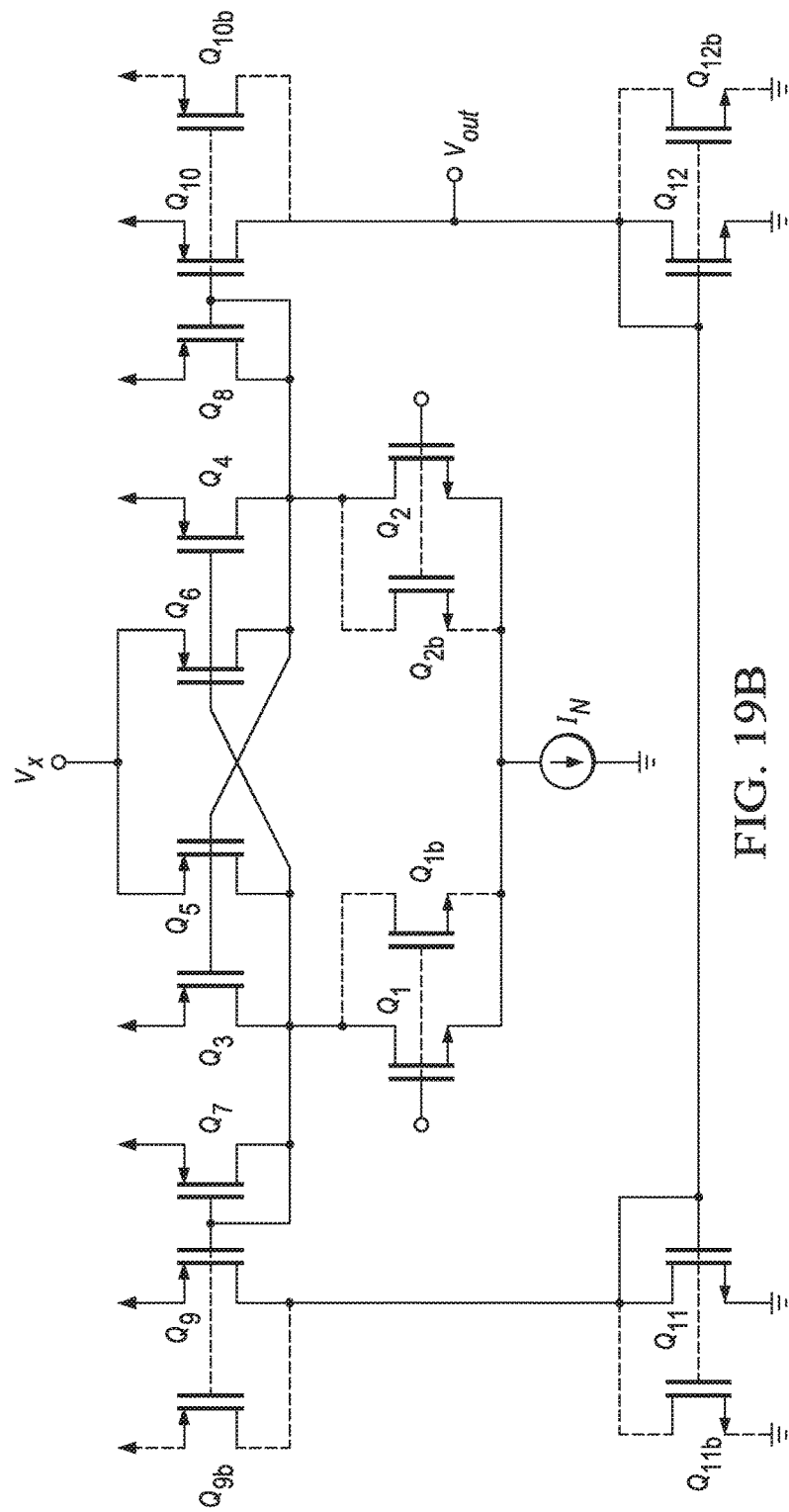

Another technique for implementing dynamic hysteresis control in a receiver circuit, such as the receiver circuit 1700, includes turning on current-controlled cross-coupled devices for finer resolution hysteresis settings. In one embodiment, the current control for the cross-coupled devices is provided via current control trim circuitry 1706 (FIGS. 17A-17B). As shown in FIGS. 17A-17B, a node at the gate of MP1 (which corresponds to Vx as shown in FIGS. 19A and 19B) is controlled by a current steering mechanism such that extra hysteresis may be fine-tuned depending on the process/voltage/temperature ("PVT"). This allows for a finer granularity higher hysteresis setting resulting from control of the current going into the cross-coupled devices using scaled current mirror devices 1714 with a few trim settings instead of directly tying the switch to Vdd. By better controlling the current, a finer gradient of added hysteresis can be achieved.

Yet another technique for implementing dynamic hysteresis control in a receiver circuit, such as the receiver circuit 1700, includes dynamically adding current mirror legs/loads or adding extra devices to a differential pair along the pre-amp stage 1800 or the comparator core 1802 to modulate the gain, which will also modulate the hysteresis, such that the trigger occurs at a lower or higher amplitude. For example, as shown in FIG. 19B, device pairs Q1 and Q2, Q9 and Q10, and Q11 and Q12 could be dynamically added, as indicated by dashed lines, in order to change the gain of the comparator 1802.

It should be noted that any of the above-described techniques may be implemented in such a way as to achieve asymmetric higher hysteresis by only adding the control circuitry to one side of the comparator/receiver/amplifier circuitry. This may also be perceived as an offset that results in an asymmetric gain and thus asymmetric hysteresis. Such an asymmetry would cater to a LOW to HIGH or a HIGH to LOW data transition, but not both, and thus result in an asymmetric higher hysteresis. For example, referring to FIGS. 19A and 19B, an asymmetric hysteresis may be implemented by dynamically adding extra devices (Q3-Q12) to device Q1 or device Q2, but not both. In contrast, embodiments illustrated and previously described above cater to both LOW to HIGH and HIGH to LOW transitions, thus implementing symmetric higher hysteresis features.

Figure 20:
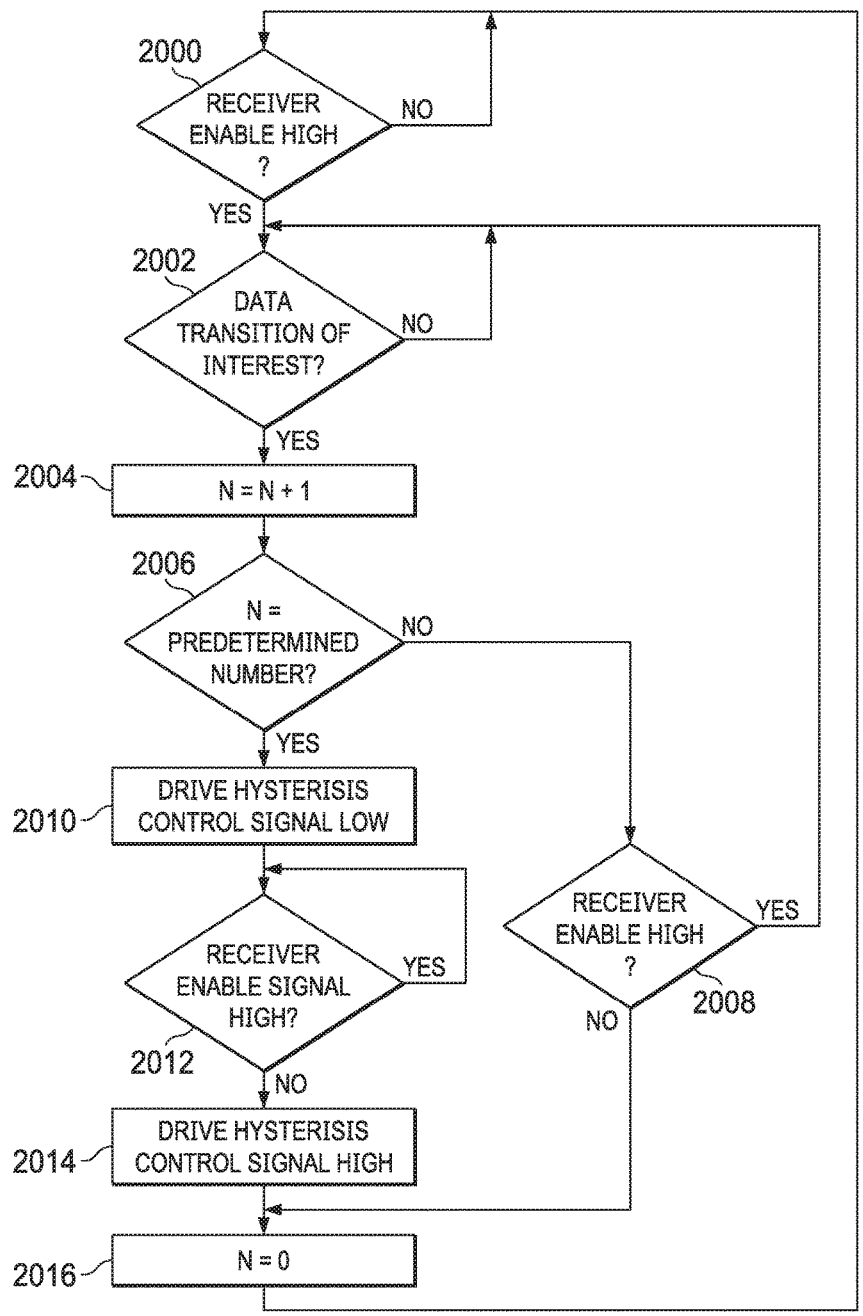
FIG. 20 is a flow diagram of a method of implementing a DH technique in a circuit in accordance with various embodiments.

FIG. 20 is a flow diagram of a method of implementing dynamic hysteresis in a circuit in accordance with embodiments described herein. Operation begins from a state in which the receiver circuit is off (i.e., the receiver enable signal is LOW), the hysteresis control signal is HIGH, meaning the receiver is in a state of high hysteresis, and a number of data transitions N is set to zero. In step 2000, a determination is made whether the receiver enable signal is HIGH, meaning the receiver is enabled (turned on). If a negative determination is made in step 2000, execution remains at step 2000 until a positive determination is made. Once a positive determination is made in step 2000, execution proceeds to step 2002, in which a determination is made whether a data transition of interest has been detected. In one embodiment, the data transition of interest is a LOW to HIGH transition; however, in alternative embodiments, the data transition of interest may be a HIGH to LOW transition. If a negative determination is made in step 2002, execution returns to step 2000. Once a positive determination is made in step 2002, execution proceeds to step 2004. In step 2004, the value of N is incremented by 1, after which execution proceeds to step 2006. In step 2006, a determination is made whether the value of N is equal to a predetermined value. In one embodiment, the predetermined value is 1; however, in alternative embodiments, the predetermined value may be greater than one. If a negative determination is made in step 2006, execution proceeds to step 2008, in which a determination is made whether the receiver enable signal is still high (i.e., the receiver is still on). If a positive determination is made in step 2008, execution returns to step 2000. If a negative determination is made in step 2008, execution proceeds to step 2009, in which N is set to zero, and then returns to step 2000.

If a positive determination is made in step 2006, execution proceeds to step 2010, in which the hysteresis control signal is driven LOW, thereby transitioning the receiver to a low (or standard) hysteresis mode. Execution then proceeds to step 2012, in which a determination is made whether the receiver enable signal is still HIGH, indicating that the receiver is still on and receiving data. Execution remains at step 2012 until a negative determination is made, at which point execution proceeds to step 2014. In step 2014, the hysteresis control signal is driven HIGH and the receiver is placed in high hysteresis mode. Execution then returns to step 2000.

It should be noted that all of the specifications, dimensions, and relationships outlined herein (e.g., the number of elements, operations, steps, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, exemplary embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to myriad other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) can include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIGURES (and their teachings) are readily scalable and can accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A method comprising:
   detecting a transition of a data signal comprising a data packet received at a circuit while the circuit is in a first hysteresis mode;
   placing the circuit in a second hysteresis mode subsequent to the detecting; and
   returning the circuit to the first hysteresis mode subsequent to completion of receipt of the data packet to await receipt of a next data packet;
   wherein the circuit comprises a comparator and wherein the returning the circuit to the first hysteresis mode comprises dynamically decreasing a number of devices comprising a feedback circuit of the comparator.

2. The method of claim 1, wherein the first hysteresis mode is a high hysteresis mode and the second hysteresis mode is a standard hysteresis mode.

3. The method of claim 1, wherein a level of each of the first and second hysteresis modes is dynamically tunable.

4. The method of claim 1, wherein the completion of receipt of the data packet is indicated by deactivation of a receiver enable signal.

5. The method of claim 1, wherein the transition comprises a LOW to HIGH transition of the data signal.

6. The method of claim 1, wherein the transition comprises a HIGH to LOW transition of the data signal.

7. The method of claim 1, wherein the transition comprises a first edge of the data packet.

8. The method of claim 1, wherein the transition comprises an Nth transition of the data signal.

9. The method of claim 1, wherein circuit comprises a comparator and wherein the placing the circuit in the second hysteresis mode comprises dynamically increasing a number of devices comprising a feedback circuit of the comparator.

10. An apparatus comprising:
   first circuitry for detecting a transition of a data signal comprising a data packet received at a circuit while the circuit is in a first hysteresis mode;
   second circuitry for placing the circuit in a second hysteresis mode subsequent to the detecting; and
   third circuitry for returning the circuit to the first hysteresis mode subsequent to completion of receipt of the data packet to await a next data packet;
   wherein the circuit comprises a comparator and wherein the placing the circuit in the second hysteresis mode comprises dynamically increasing a number of devices comprising a feedback circuit of the comparator.

11. The apparatus of claim 10, wherein the first hysteresis mode is a high hysteresis mode and the second hysteresis mode is a standard hysteresis mode and wherein a level of each of the first and second hysteresis modes is dynamically tunable.

12. The apparatus of claim 10, wherein the transition comprises one of a LOW to HIGH transition and a HIGH to LOW transition.

13. The apparatus of claim 10, wherein the transition comprises a first edge of the data packet.

14. The apparatus of claim 10, wherein the transition comprises an Nth transition of the data signal.

15. The apparatus of claim 10, wherein the circuit comprises a comparator and wherein the returning the circuit to the first hysteresis mode comprises dynamically decreasing a number of devices comprising a feedback circuit of the comparator.

16. The apparatus of claim 10 wherein the comparator comprises:
   a comparator core; and
   a plurality of pairs of cross-coupled devices, wherein a number of the cross-coupled devices connected to provide a feedback circuit for the comparator core is dynamically controllable to control a hysteresis level of the comparator.

17. The apparatus of claim 16, wherein the number of the cross-coupled devices connected to provide a feedback circuit for the comparator core is dynamically controllable via a control current.

18. A method comprising:
   detecting a transition of a data signal comprising a data packet received at a circuit while the circuit is in a first hysteresis mode;
   placing the circuit in a second hysteresis mode subsequent to the detecting; and
   returning the circuit to the first hysteresis mode subsequent to completion of receipt of the data packet to await receipt of a next data packet;
   wherein circuit comprises a comparator and wherein the placing the circuit in the second hysteresis mode comprises dynamically increasing a number of devices comprising a feedback circuit of the comparator.

19. The method of claim 18, wherein a level of each of the first and second hysteresis modes is dynamically tunable.

20. The method of claim 18, wherein the transition comprises an Nth transition of the data signal.

* * * * *